US012575133B2

(12) United States Patent
Chu et al.

(10) Patent No.: US 12,575,133 B2
(45) Date of Patent: Mar. 10, 2026

(54) TRANSISTOR DEVICE WITH WORK FUNCTION METAL LAYERS AND METHOD THEREOF

(71) Applicant: Taiwan Semiconductor Manufacturing Company, Ltd., Hsinchu (TW)

(72) Inventors: Lung-Kun Chu, New Taipei City (TW); Jia-Ni Yu, New Taipei City (TW); Chun-Fu Lu, Hsinchu (TW); Chung-Wei Hsu, Hsinchu County (TW); Kuo-Cheng Chiang, Hsinchu County (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 938 days.

(21) Appl. No.: 17/841,687

(22) Filed: Jun. 16, 2022

(65) Prior Publication Data

US 2023/0411479 A1 Dec. 21, 2023

(51) Int. Cl.
H10D 30/67 (2025.01)
H10D 30/01 (2025.01)
(Continued)

(52) U.S. Cl.
CPC ....... H10D 30/6735 (2025.01); H10D 30/024 (2025.01); H10D 30/031 (2025.01);
(Continued)

(58) Field of Classification Search
CPC ............. H10D 30/6735; H10D 30/024; H10D 30/6713; H10D 30/6757; H10D 64/021;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Wasiul Haider
(74) *Attorney, Agent, or Firm* — JCIPRNET

(57) ABSTRACT

A semiconductor device and a manufacturing method thereof are provided. The method includes the following steps. A fin structure extending along a first direction and having a lower fin structure and an upper fin structure disposed over the lower fin structure is formed, the upper fin structure includes first semiconductor layers and second semiconductor layers alternately stacked. A sacrificial gate structure extending along a second direction perpendicular to the first direction is formed over the upper fin structure. Gate spacers are formed on the sacrificial gate structure. A portion of the sacrificial gate structure is removed to expose the gate spacers. Portions of the exposed gate spacers are removed to form a first gate trench with a first dimension along the first direction. The rest of the sacrificial gate structure is removed to form a second gate trench with a second dimension along the first direction under the first gate trench, wherein the first dimension is greater than the second dimension. A gate dielectric and a first work function metal layer sequentially covering the first and second gate trenches are formed, wherein a first portion of the first work function metal layer merge in the second gate trench, and a second portion of the first work function metal layer is located on sidewalls of the first gate trench. The second portion of the first work function metal layer is removed to expose the gate dielectric located on sidewalls of the first gate trench while remaining the first portion of the first work function metal layer. A second work function metal layer is formed over the first portion of the first work function metal layer to fill the first gate trench.

20 Claims, 19 Drawing Sheets

(51) Int. Cl.

| | |
|---|---|
| *H10D 30/62* | (2025.01) |
| *H10D 64/01* | (2025.01) |
| *H10D 84/01* | (2025.01) |
| *H10D 84/03* | (2025.01) |

(52) U.S. Cl.
CPC ..... *H10D 30/6211* (2025.01); *H10D 30/6713* (2025.01); *H10D 30/6757* (2025.01); *H10D 64/021* (2025.01); *H10D 84/0128* (2025.01); *H10D 84/013* (2025.01); *H10D 84/0147* (2025.01); *H10D 84/0158* (2025.01); *H10D 84/038* (2025.01)

(58) Field of Classification Search
CPC ............. H10D 84/0128; H10D 84/013; H10D 84/0147; H10D 84/0158; H10D 30/014; H10D 30/43; H10D 62/121; H10D 64/017; H10D 84/016
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2019/0081152 | A1* | 3/2019 | Suh ..................... H10D 62/121 |

* cited by examiner

TRANSISTOR DEVICE WITH WORK FUNCTION METAL LAYERS AND METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. However, the final meta-gate height (MGH) control and MGH reduction has been very challenging when using conventional meta-gate etching-back (MGEB) process due to the etching process variations arising from various meta-gate layers and spacing loading.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A through FIG. 2H are schematic cross-sectional views of various stages in a manufacturing method of a semiconductor device in accordance with some embodiments of the disclosure.

DETAILED DESCRIPTION

Figure 1A:
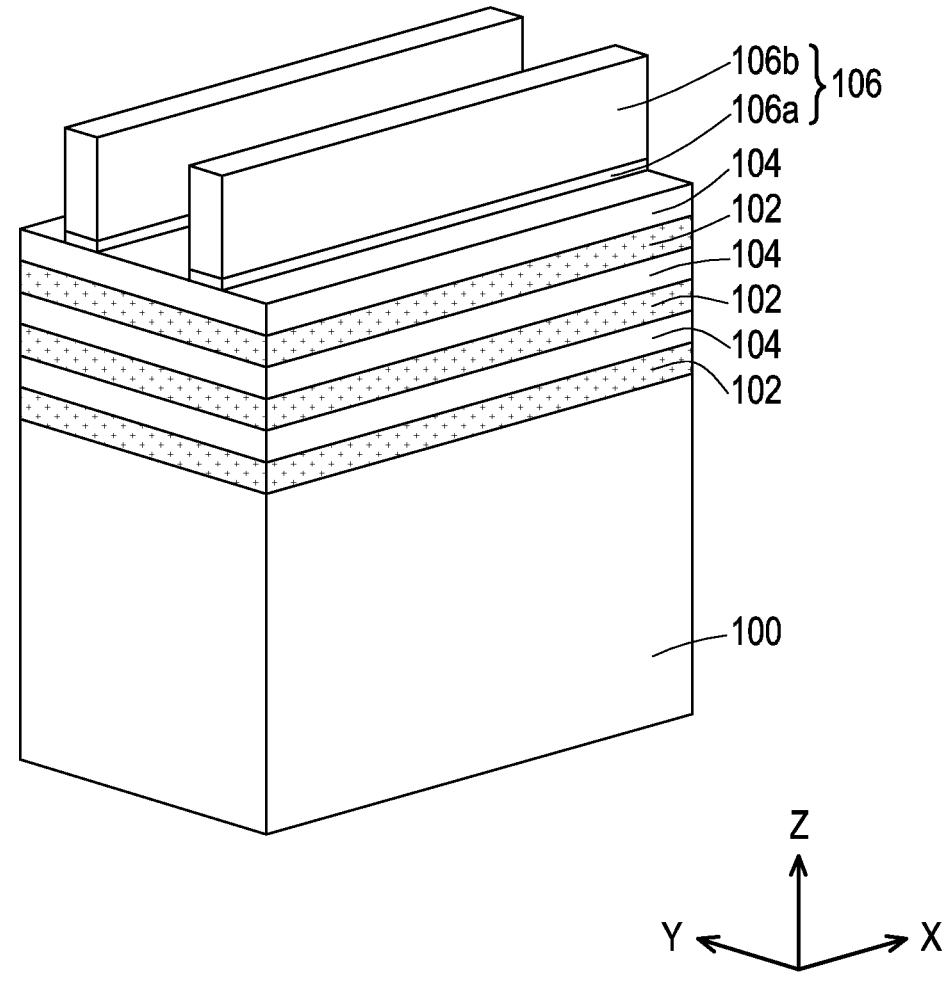
FIG. 1A through FIG. 1H are schematic perspective views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The embodiments are intended to provide further explanations but are not used to limit the scope of the present disclosure. The specific embodiment(s) described herein is related to a structure containing one or more semiconductor devices, and is not intended to limit the scope of the present disclosure. Embodiments of the present disclosure describe the exemplary manufacturing process of the structure(s) formed with one or more semiconductor devices such as transistors and the integrated structures fabricated there-from. Certain embodiments of the present disclosure are related to the structures including semiconductor transistors and/or other elements. The substrates and/or wafers may include one or more types of integrated circuits or electronic components therein. The semiconductor device(s) may be formed on a bulk semiconductor substrate or a silicon/germanium-on-insulator substrate. In addition, source/drain region(s) may refer to a source or a drain, individually or collectively dependent upon the context.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1A through FIG. 1H are schematic perspective views of various stages in a manufacturing method of a semiconductor device 10 in accordance with some embodiments of the disclosure. FIG. 2A through FIG. 2H are schematic cross-sectional views of various stages in a manufacturing method of the semiconductor device 10 in accordance with some embodiments of the disclosure. FIG. 2A is the cross-sectional view taken along line A-A' shown in FIG. 1H. It is understood that additional operations can be provided before, during, and after the operations shown by FIGS. 1A-1H and FIGS. 2A-2H, and some of the operations described below can be replaced or eliminated, for additional embodiments of the method. The order of the operations/processes may be interchangeable.

The semiconductor device 10 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type field-effect transistors (PFETs), n-type FETs (NFETs), fin-like FETs (FinFETs), metal-oxide semiconductor field effect transistors (MOS-FET), complementary metal-oxide semiconductor (CMOS) transistors, bipolar transistors, high voltage transistors, high frequency transistors, and/or other memory cells. The semiconductor device 10 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, the semiconductor device 10 may be a portion of an IC chip, a system on chip (SoC), or portion thereof. In some embodiments, the semiconductor device 10 is a field-effect transistor such as a fin field-effect transistor (FinFET). The present disclosure is not limited to any particular number of devices or device regions, or to any particular device configurations.

Figure 2A:
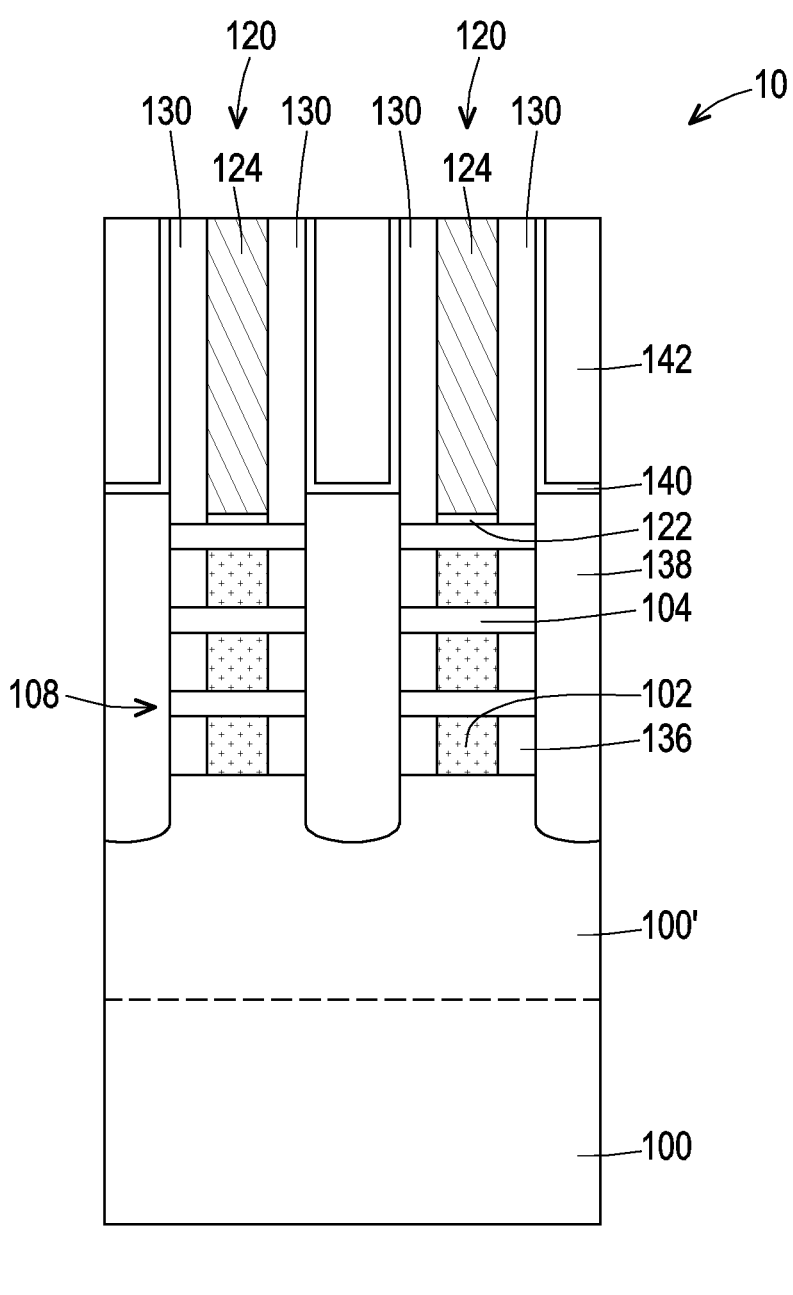
Figure 2A:
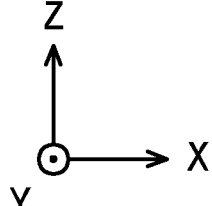

Referring to FIG. 1A, a substrate (wafer) 100 is provided. In the depicted embodiment, the substrate 100 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 100 is doped with a p-type or n-type dopant of a dopant concentration about $1 \times 10^{15}$ atoms/cm$^{-3}$ to about $1 \times 10^{19}$ atoms/cm$^{-3}$.

The substrate 100 may include various doped regions. In some embodiments, the substrate 100 includes n-type doped regions (for example, n-type wells) doped with n-type dopants, such as phosphorus (for example, $^{31}$P), arsenic, other n-type dopant, or combinations thereof. In some embodiments, the substrate 100 includes p-type doped region (for example, p-type wells) doped with p-type dopants, such as boron (for example, $^{11}$B, BF$_2$), indium, other p-type dopant, or combinations thereof. In some embodiments, the substrate 100 includes doped regions formed with a combination of p-type dopants and n-type dopants. The various doped regions can be formed directly on and/or in the substrate 100, for example, providing a p-well structure, an n-well structure, a dual-well structure, a raised structure, or combinations thereof. An ion implantation process, a diffusion process, and/or other suitable doping process can be performed to form the various doped regions.

The substrate 100 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 100 comprises silicon germanium (SiGe) buffer layers epitaxially grown on the silicon substrate 100. The Ge concentration of the SiGe buffer layers may increase from 30 atomic % germanium for the bottommost buffer layer to 70 atomic % germanium for the topmost buffer layer.

Still referring to FIG. 1A, stacked semiconductor layers are formed over the substrate 100. The stacked semiconductor layers include first semiconductor layers 102 and second semiconductor layers 104. As shown in FIG. 1, the first semiconductor layers 102 and the second semiconductor layers 104 are alternately formed on the substrate 100, so as to form a stacking structure on the substrate 100. In some embodiments, the first semiconductor layers 102 and the second semiconductor layers 104 are made of different semiconductor materials, such that the first semiconductor layers 102 could have a sufficient etching selectivity with respect to the second semiconductor layers 104. From another point of view, the first semiconductor layers 102 and the second semiconductor layers 104 are made of materials having different lattice constants. In some embodiments, the material of each of the first semiconductor layers 102 and the second semiconductor layers 104 includes Si, Ge, SiGe, GeSn, SiGeSn, GaAs, InSb, GaP, GaSb, InAlAs, InGaAs, GaSbP, GaAsSb or InP. In some embodiments, the first semiconductor layers 102 are made of SiGe, whereas the second semiconductor layers 104 are made of Si. In certain embodiments, the first semiconductor layers 102 are made of Si$_{1-x}$Ge$_x$, where $0.15 \leq x \leq 0.5$, and second semiconductor layers 104 are made of Si. In some embodiments, $0.15 \leq x \leq 0.25$. In other embodiments, the second semiconductor layers 104 are made of Si$_{1-y}$Ge$_y$, where y is equal to or less than about 0.2 and x>y.

In FIG. 1A, three layers of the first semiconductor layer 102 and three layers of the second semiconductor layer 104 are disposed. However, the number of the layers are not limited to three, and may be as small as 1 (each layer) and in some embodiments, 2-20 layers of each of the first and second semiconductor layers are formed. By adjusting the numbers of the stacked layers, a driving current of the semiconductor device 10 can be adjusted.

In some embodiments, the first semiconductor layers 102 and the second semiconductor layers 104 are epitaxially formed over the substrate 100. The thickness of the first semiconductor layers 102 may be equal to or smaller than that of the second semiconductor layers 104, and is in a range from about 2 nm to about 10 nm in some embodiments, and is in a range from about 3 nm to about 5 nm in other embodiments. The thickness of the second semiconductor layers 104 is in a range from about 5 nm to about 20 nm in some embodiments, and is in a range from about 7.5 nm to about 12.5 nm in other embodiments. The thickness of each of the first and second semiconductor layers may be the same, or may vary. In some embodiments, the bottom first semiconductor layer (the closest layer to the substrate 100) is thicker than the remaining first semiconductor layers. The thickness of the bottom first semiconductor layer is in a range from about 10 nm to about 50 nm in some embodiments, or is in a range from 20 nm to 40 nm in other embodiments.

Further, still referring to FIG. 1A, mask structures 106 formed over the stacking structure. In some embodiments, the mask structures 106 are hard mask structure. In some embodiments, the mask structures 106 are arranged along a second direction Y, and are extending along a first direction X intersected with the second direction Y (e.g., perpendicular to the second direction Y). In addition, in some embodiments, each mask structure 106 includes a first mask layer 106a and a second mask layer 106b formed over the first mask layer 106a. The first mask layer 106a and the second mask layer 106*b* may be made of different insulating materials. For instance, materials of the first mask layer 106*a* and the second mask layer 106*b* may be selected from a group consisting of silicon oxide, silicon nitride, silicon oxynitride and the like. A method for forming the mask structures 106 may include one or more deposition process (e.g., chemical vapor deposition (CVD) process, physical vapor deposition (PVD) process, atomic layer deposition (ALD) process), a thermal oxidation, and a self-aligned multiple patterning process (e.g., a self-aligned double patterning (SADP) process or a self-aligned quadruple patterning (SAQP) process). In some embodiments, the first mask layer 106*a* is a pad oxide layer made of a silicon oxide, which can be formed by a thermal oxidation. The second mask layer 106*b* is made of a silicon nitride, which is formed by CVD process, including low pressure CVD (LPCVD) process and plasma enhanced CVD (PECVD) process, PVD process, ALD process, or other suitable process. The mask structures 106 are patterned into a mask pattern by using patterning operations including photo-lithography and etching process.

Figure 1B:
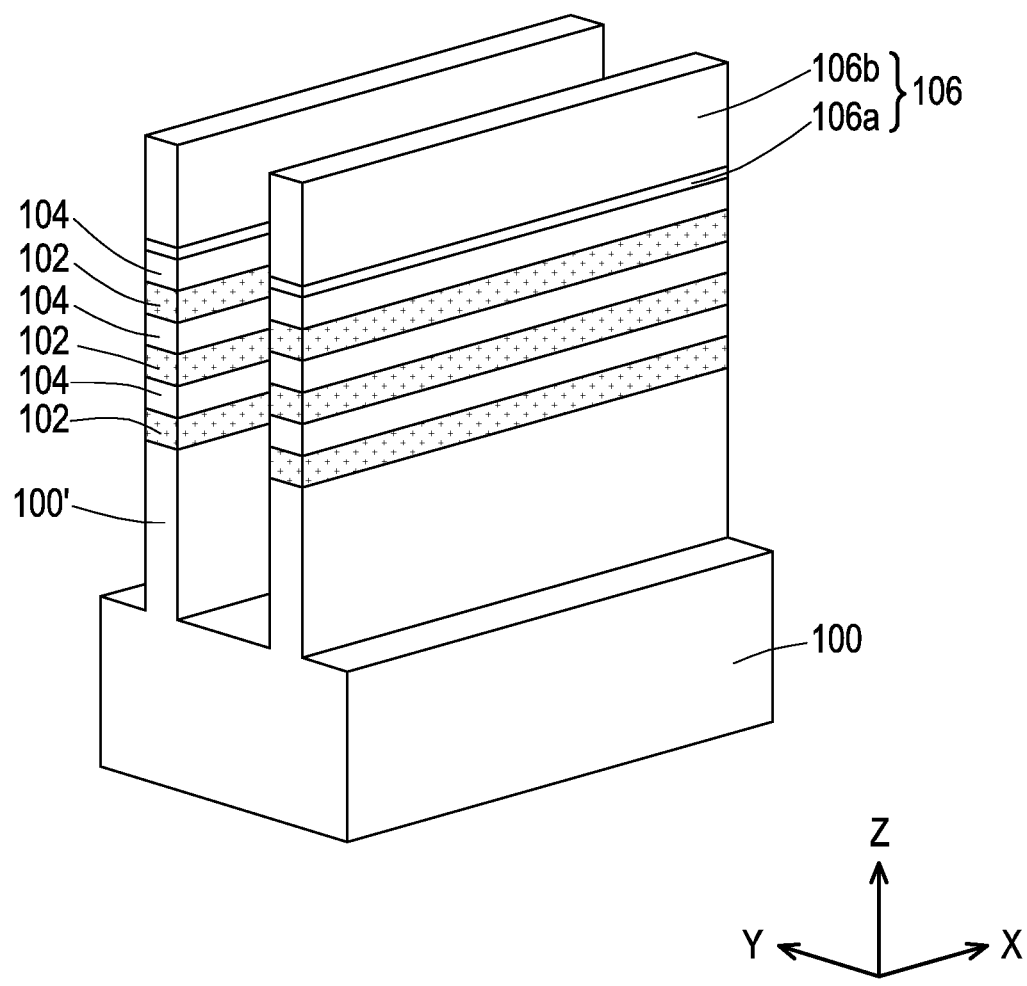

Referring to FIG. 1B, a top portion of the substrate 100, the stacking structure of the first semiconductor layers 102 and the second semiconductor layers 104 are patterned into fin structures 108 by using the hard mask structures 106 as shadow masks. As shown in FIG. 1B, the fin structures 108 are formed to extend from the substrate 100. In those embodiments where the hard mask structures 106 are arranged along the second direction Y and extending along the first direction X, the formed fin structures 108 are also arranged along the second direction Y and extending along the first direction X. A method for patterning the top portion of the substrate 100 and the stacking structure to form the fin structures 108 may include an etching process, such as an anisotropic etching process. The first semiconductor layers 102 are sacrificial layers which are subsequently partially removed, and the second semiconductor layers 104 are subsequently formed into channel layers of the semiconductor device 10.

As depicted in FIG. 1B, each of the fin structures 108 includes the patterned top portion of the substrate (i.e., a fin substrate 100'), and the patterned stacking structure including the first semiconductor layers 102 and the second semiconductor layers 104 alternately stacked. In detail, the fin structures 108 have upper portions constituted by the stacked semiconductor layers (i.e., the first semiconductor layers 102 and the second semiconductor layers 104) and lower portions constituted by the fin substrates 100', which also referred to as the lower fin structures. The fin structures 108 define the active regions of the semiconductor device 10. In FIG. 1B, two fin structures 108 are arranged in the second direction Y. But the number of the fin structures is not limited to two, and may be as small as one and three or more. In some embodiments, one or more dummy fin structures are formed on both sides of the fin structures 108 to improve pattern fidelity in the patterning operations. In some embodiments, the two fin structures 108 are for different types of FETs. In other embodiments, the two fin structures 108 are for the same type FET.

Figure 1C:
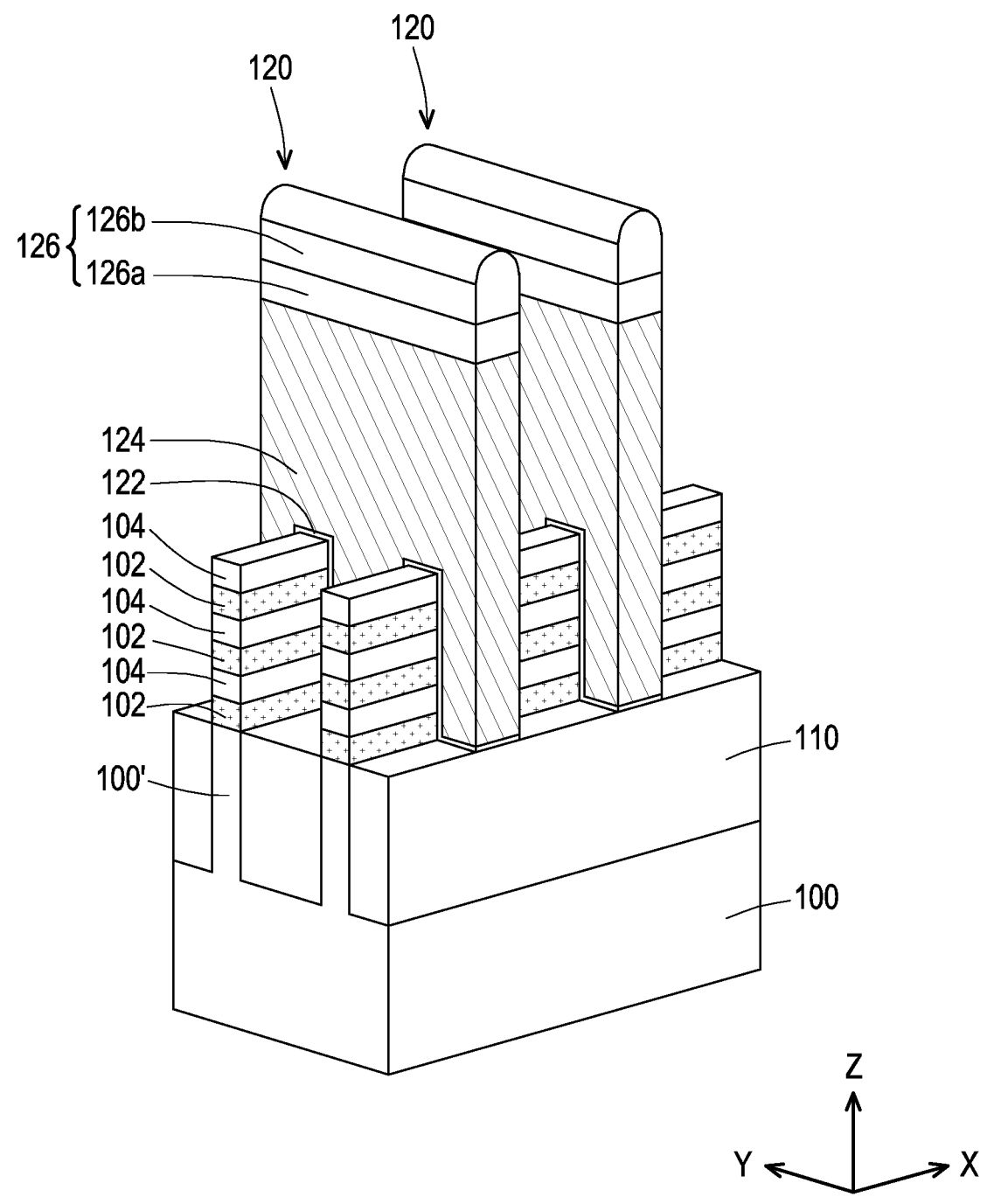

Referring to FIG. 1C, an isolation structure 110 is formed to separate and isolate the active regions of semiconductor device 10. In other words, the fin structures 108 are electrically separated from each other by the isolation structure 110. In some embodiments, the isolation structure 110 is also called a shallow trench isolation (STI). In some embodiments, a dielectric material layer, such as silicon oxide, silicon nitride, silicon oxynitride (SiON), SiOCN, SiCN, fluorine-doped silicate glass (FSG), or a low-K dielectric material, is deposited over the substrate 100 along sidewalls of the fin structure 108, so that the fin structures 108 are fully embedded in the dielectric material layer. The dielectric material layer may be deposited by CVD, LPCVD, PECVD, flowable CVD, PVD, thermal oxidation, or other techniques. An anneal operation may be performed after the formation of the dielectric material layer. Then, a planarization operation, such as a chemical mechanical polishing (CMP) method and/or an etch-back method, is performed such that the top surface of the uppermost second semiconductor layer 104 is exposed from the dielectric material layer. That is to say, during the planarization operation, the mask structures 106 (in FIG. 1B) are removed. Subsequently, the dielectric material layer is recessed (for example, by etching) to form the isolation structure 110 so that the upper portions of the fin structures 108 are exposed. In the embodiment shown in FIG. 1C, the lower fin structures (i.e., fin substrates 100') are covered by the isolation structure 110. As depicted in FIG. 1C, a top surface of the isolation structure 110 is substantially flush with a bottom surface of the bottommost first semiconductor layer 102. However, the disclosure is not limited thereto. In some alternative embodiments, the dielectric material layer is recessed until the top of each of the lower fin structures is exposed. That is to say, in such embodiments, the top surface of the isolation structure 110 is lower than the bottom surface of the bottommost first semiconductor layer 102 (and, thus, is lower than top surfaces of the fin substrates 100'). Further, in some alternative embodiments, the top surface of the isolation structure 110 is higher than the bottom surface of the bottommost first semiconductor layer 102.

In some embodiments, one or more liner layers (not shown) are formed before forming the dielectric material layer. The liner layer is made of SiN or a silicon nitride-based material (e.g., SiON, SiCN or SiOCN). In some embodiments, the liner layer has a thickness between about 1 nm and about 20 nm. In some embodiments, two liner layers are formed over the substrate 100, one of the two liner layers includes silicon oxide and has a thickness between about 0.5 nm and about 5 nm, and another one of the two liner layers includes silicon nitride and has a thickness between about 0.5 nm and about 5 nm. The liner layers may be deposited through one or more processes such as PVD, CVD, or ALD, although any acceptable process may be utilized.

Still referring to FIG. 1C, sacrificial gate structures 120 are formed over the fin structures 108 and the isolation structure 110. An extending direction of the sacrificial gate structures 120 is intersected with an extending direction of the fin structures 108, and the sacrificial gate structures 120 cover portions of the fin structures 108 that are overlapped with the sacrificial gate structures 120. In detail, each sacrificial gate structure 120 is formed over portions of the corresponding fin structures 108 which are to be channel regions. In other words, the sacrificial gate structure 120 defines the channel region of the semiconductor device 10. In those embodiments where the fin structures 108 are arranged along the second direction Y and extending along the first direction X, the sacrificial gate structures 120 may be arranged along the first direction X and extend along the second direction Y.

In some embodiments, each sacrificial gate structure 120 includes a sacrificial gate dielectric layer 122 and a sacrificial gate electrode 124. In some embodiments, no sacrificial gate dielectric layer is formed. The sacrificial gate dielectric layer 122 is conformally formed over the fin structures 108 and the isolation structure 110, whereas the sacrificial gate electrode 124 covers the sacrificial gate dielectric layer 122, and are formed to a height greater than a height of the fin structures 108. In some embodiments, each sacrificial gate structure 120 further includes a capping structure 126 lying on the sacrificial gate electrode 124. The capping structure 126 may include a capping layer 126a and a capping layer 126b lying above the capping layer 126a. In some embodiments, the capping layer 126b has rounded top corners. Materials of the sacrificial gate dielectric layer 122, the capping layer 126a and the capping layer 126b may respectively include silicon oxide, silicon nitride, silicon oxynitride, the like or combinations thereof, whereas a material of the sacrificial gate electrode 124 may include polysilicon.

In some embodiments, the formation of the sacrificial gate structures 120 includes sequentially forming a sacrificial gate dielectric material layer, a sacrificial gate electrode layer and capping material layers over the substrate 100, and then patterning the sacrificial gate dielectric material layer, the sacrificial gate electrode layers and the capping material layer. The sacrificial gate dielectric material layer, the sacrificial gate electrode layers are deposited using CVD, including LPCVD and PECVD, PVD, ALD, or other suitable process. A photo-lithography and etching process is performed to pattern the sacrificial gate dielectric material layer, the sacrificial gate electrode layer and the capping material layer to form the sacrificial gate structures 120 over the channel regions of the fin structures 108. The photo-lithography process includes resist coating (for example, spin-on coating), soft baking, mask aligning, exposure, post-exposure baking, developing the resist, rinsing, drying (for example, hard baking), other suitable processes, or combinations thereof. The etching process includes dry etching, wet etching, other etching methods, or combinations thereof.

By patterning the sacrificial gate structures 120, the upper portions of the fin structures 108 with the first semiconductor layers 102 and the second semiconductor layers 104 are partially exposed on opposite sides of each sacrificial gate structure 120, thereby defining source/drain (S/D) regions, as shown in FIG. 1C. In this disclosure, a source and a drain are interchangeably used and the structures thereof are substantially the same. In FIG. 1C, two sacrificial gate structures 120 are arranged in the second direction X. But the number of the sacrificial gate structures is not limited to two, and may be as small as one and three or more. In certain embodiments, one or more dummy sacrificial gate structures are formed on both sides of the sacrificial gate structures to improve pattern fidelity.

Figure 1D:
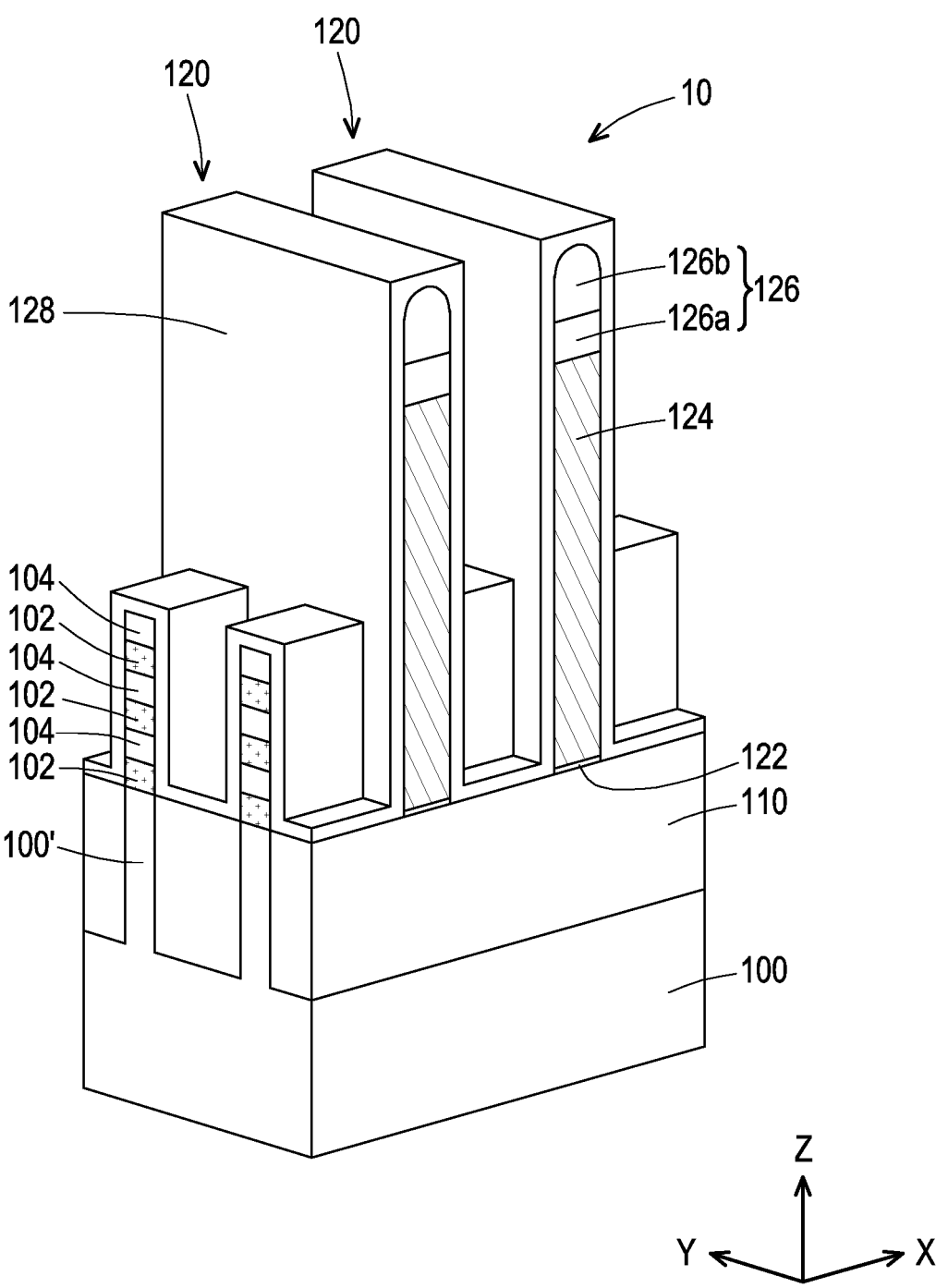

Referring to FIG. 1D, a gate spacer layer 128 is formed on the current structure. In some embodiments, the gate spacer layer 128 is globally formed over the structure as shown in FIG. 1C. In these embodiments, the isolation structure 110, the fin structures 108 and the sacrificial gate structures 120 may be conformally covered by the gate spacer layer 128. A material of the gate spacer layer 128 may include silicon oxide, silicon nitride, silicon carbide, silicon oxynitride, SiCN, silicon oxycarbide, SiOCN, the like or combinations thereof, and a method for forming the gate spacer layer 128 may include a deposition process, such as a CVD process or an ALD process. In some embodiments, the gate spacer layer 128 is deposited to a thickness in a range from about 2 nm to about 10 nm. In the embodiment shown in FIG. 1D, the gate spacer layer 128 is a single layer. However, the disclosure is not limited thereto. In some alternative embodiments, the gate spacer layer 128 includes a multi-layer structure, such as a first dielectric layer that includes silicon nitride and a second dielectric layer that includes silicon oxide.

Figure 1E:
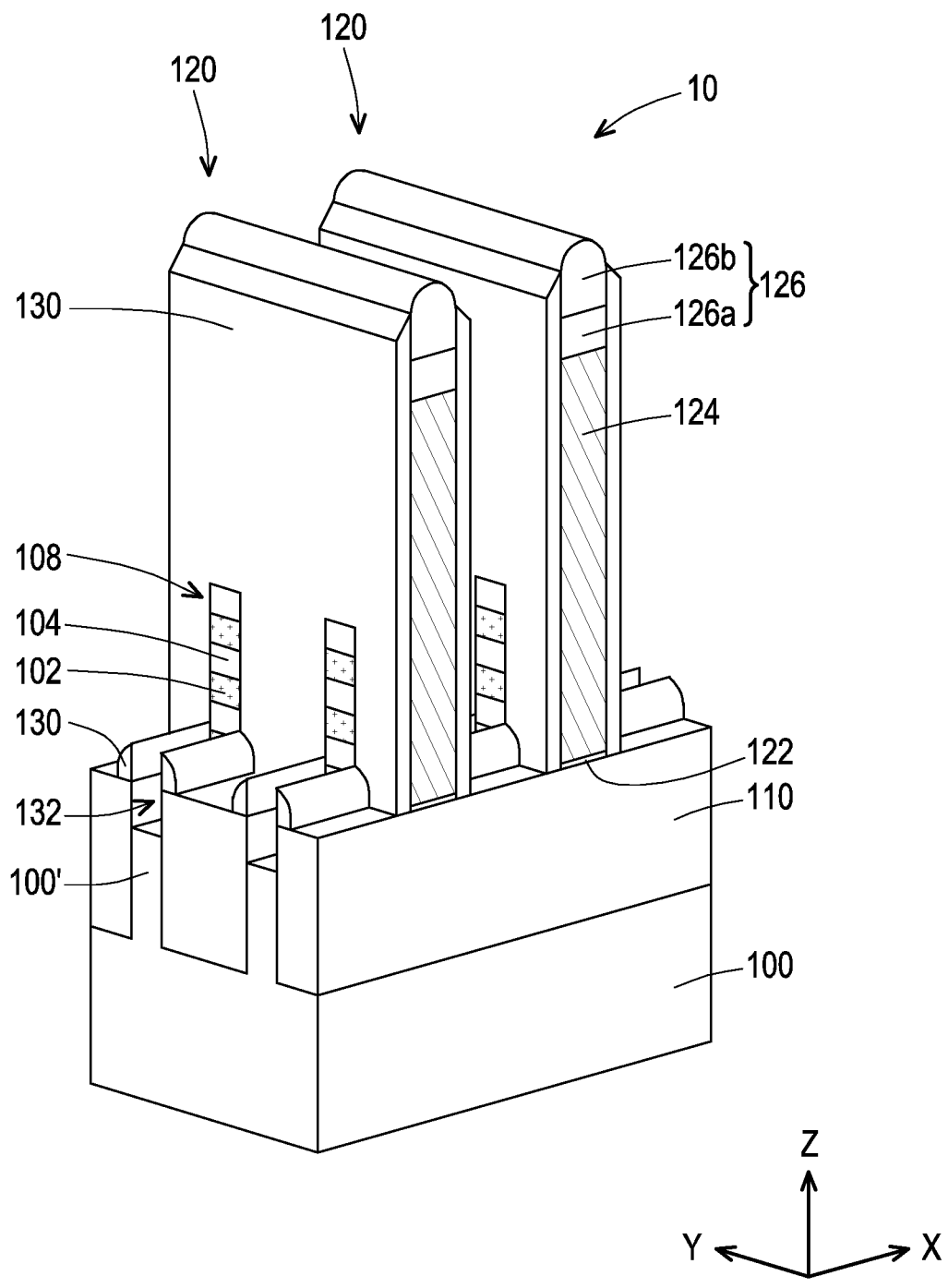

Referring to FIG. 1E, after the gate spacer layer 128 is formed, an etching process is performed on the gate spacer layer 128. In some embodiments, the etching process is an anisotropic etching process. During the etching process, most of the gate spacer layer 128 is removed from horizontal surfaces, leaving the sidewall spacers 130 on the vertical surfaces such as the sidewalls of the sacrificial gate structures 120 and the sidewalls of the exposed fin structures 108. That is to say, portions of the gate spacer layer 128 in the X-Y plane are removed and portions of the gate spacer layer 128 along a vertical direction Z perpendicular to the first direction X and the second direction Y remain substantially unchanged and form the sidewall spacers 130. The sidewall spacers 130 formed on the sidewalls of the sacrificial gate structures 120 are also referred to as gate spacers. As shown in FIG. 1E, the capping structure 126 (e.g., the capping layer 126b) is exposed from the sidewall spacers 130. In some embodiments, isotropic etching may be subsequently performed to remove portions of the sidewall spacers 130 from the upper portions of the S/D regions of the exposed fin structures 108. In some embodiments, a thickness of the sidewall spacers 130 is about 1 nm to about 10 nm.

Subsequently, still referring to FIG. 1E, the fin structures 108 of the S/D regions are recessed down below the top surface of the isolation structure 110 to form recesses 132. The S/D recessed process may be performed by using dry etching and/or wet etching. As shown in FIG. 1E, the sidewall spacers 130 formed on the S/D regions of the exposed fin structures 108 partially remain. In such embodiments, the recesses 132 are formed between the remained sidewall spacers 130. However, the disclosure is not limited thereto. In some alternative embodiments, the sidewall spacers 130 formed on the S/D regions of the exposed fin structures 108 are fully removed. As depicted in FIG. 1E, each of the recesses 132 includes sidewalls formed by the isolation structure 110 and a bottom surface formed by a top surface of the corresponding fin substrate 100'. Further, at this stage, end portions of the stacking structure of the first and second semiconductor layers 102, 104 under the sacrificial gate structures 120 have substantially flat faces which are flush with the sidewall spacers 130, as shown in FIG. 1E. In some embodiments, the end portions of the stacking structure of the first and second semiconductor layers 102, 104 are slightly horizontally etched.

Figure 1F:
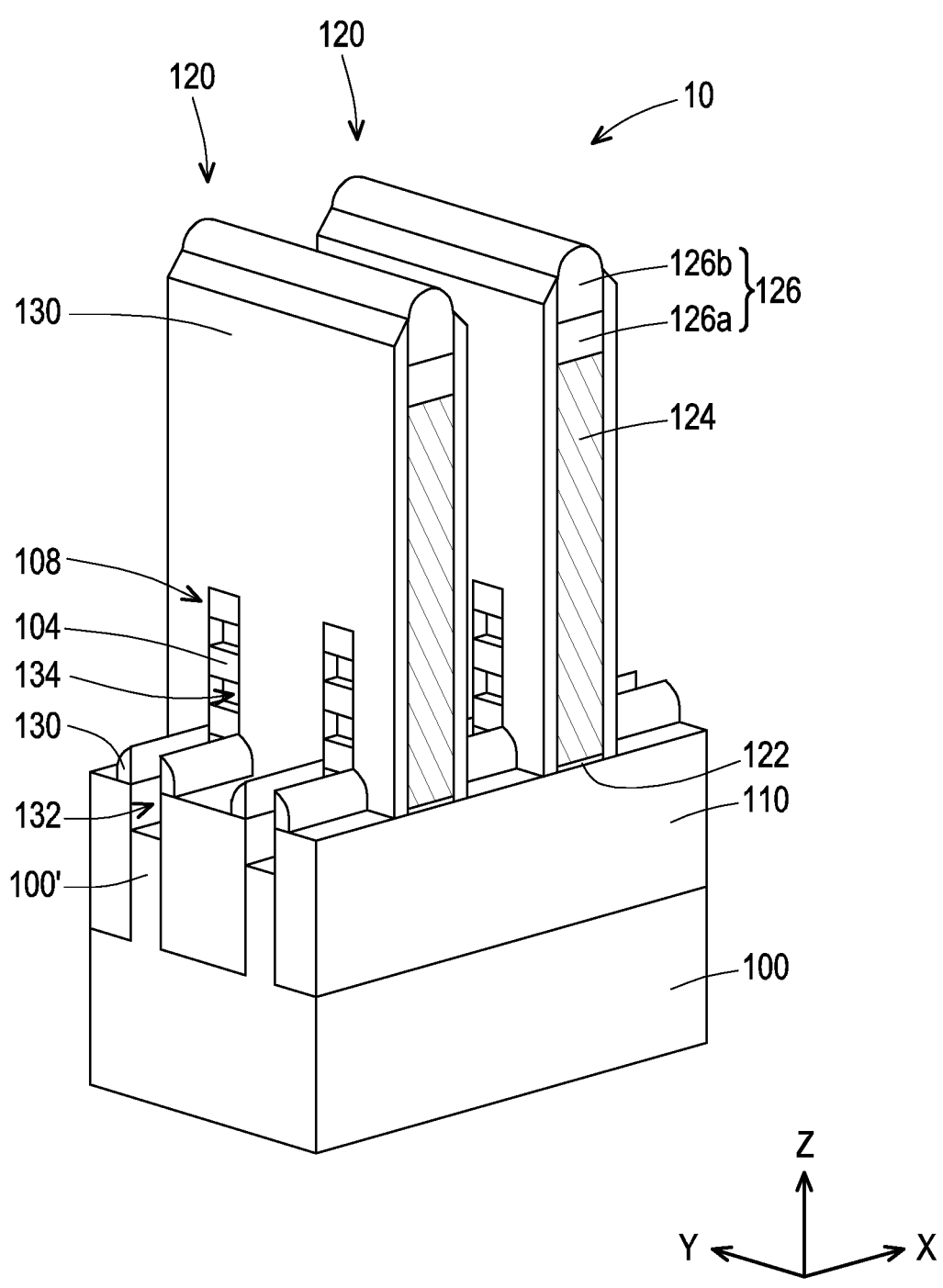

Referring to FIG. 1F, the first semiconductor layers 102 are laterally recessed from the second semiconductor layers 104 and the sidewall spacers 130 formed on the sidewalls of the sacrificial gate structures 120 (i.e., the gate spacers). As such, recesses 134 are formed at sidewalls of the remained portions of the fin structures 108. From another point of view, the recesses 134 are formed between the second semiconductor layers 104 and between the bottommost second semiconductor layers 104 and the fin substrates 100', such that portions (edges) of the second semiconductor layers 104 are suspended. In some embodiments, the first semiconductor layers 102 are laterally recessed from the gate spacers by a distance ranging from about 2 nm to about 10 nm. A method for lateral recessing the first semiconductor layers 102 may include an etching process, such as an isotropic etching process. By properly selecting etchants for the etching process and/or by properly selecting the materials of the first semiconductor layers 102 and the second semiconductor layers 104, the first semiconductor layers 102 can be etched without consuming the second semiconductor layers 104 and other components in the current structure. As discussed above, in some embodiments, the first semiconductor layers 102 include SiGe, and the second semiconductor layers 104 include Si.

In some embodiments, the first semiconductor layers 102 are laterally recessed (etched) so that edges of the first semiconductor layers 102 are located substantially below a side face of the sacrificial gate electrode 124. In some embodiments, end portions (edges) of the first semiconductor layers 102 under the sacrificial gate structure are substantially flush with the side faces of the sacrificial gate electrode 124. Here, "being substantially flush" means the difference in the relative position is less than about 1 nm. In some embodiments, during the recess etching of the first semiconductor layers 102 and/or the recess etching of the fin structures 108 of the S/D regions as described with FIG. 1E, end portions of the second semiconductor layers 104 are also laterally etched. The recessed amount of the first semiconductor layers 102 is greater than the recessed amount of the second semiconductor layers 104. In some embodiments, the second semiconductor layers 104 are laterally recessed from the gate spacers by a distance ranging from about 1 nm to about 4 nm, and the difference of the distance by which the first semiconductor layers 102 are laterally recessed from the gate spacers and the distance by which the second semiconductor layers 104 are laterally recessed from the gate spacers is in a range from about 1 nm to about 9 nm.

Figure 1G:
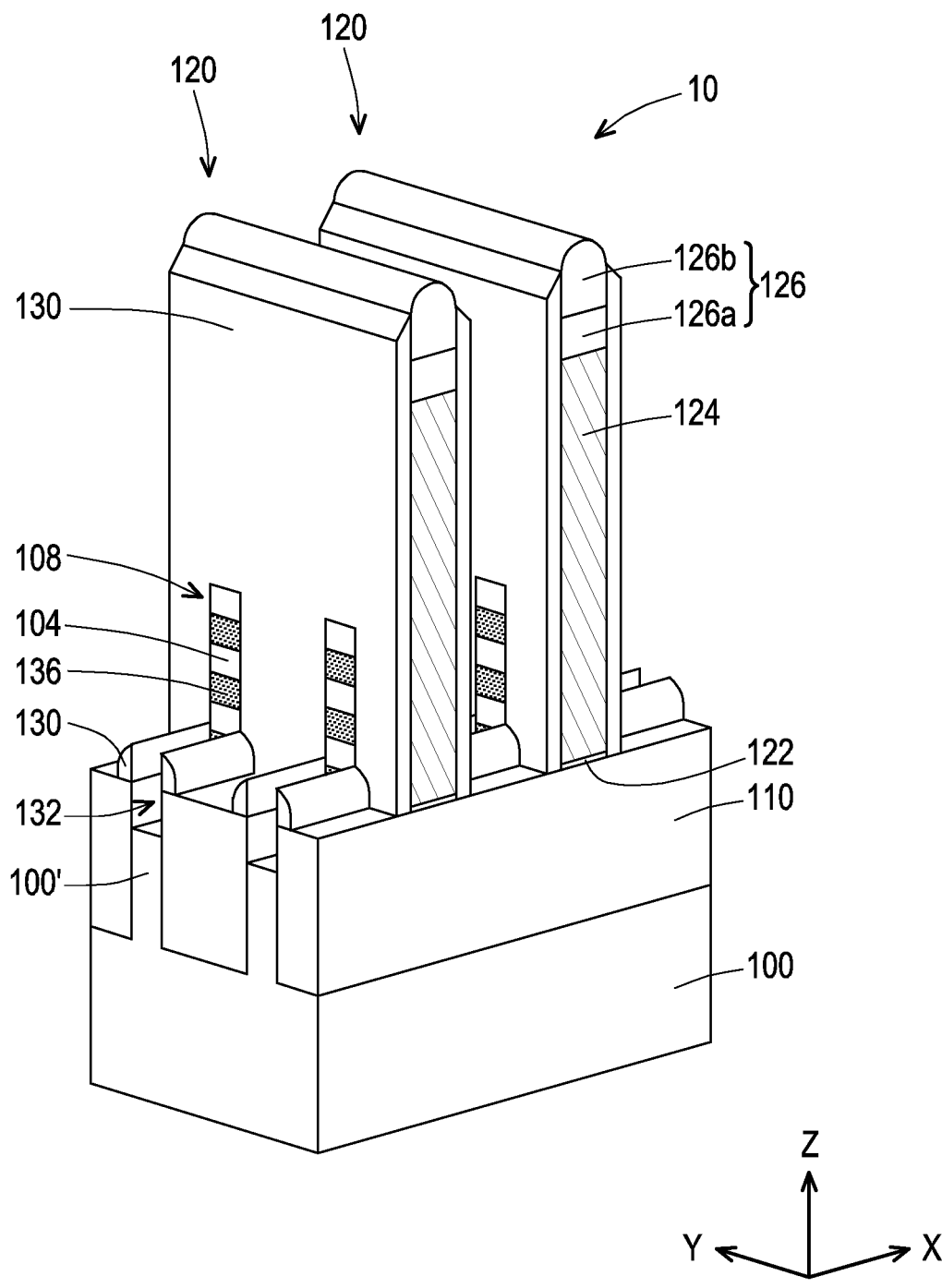

Referring to FIG. 1G, an insulating material is filled in the recesses 134 at the sidewalls of the fin structures 308 to form inner spacers 136. In some embodiments, as shown in FIG. 1G, exposed surfaces of the inner spacers 136 are substantially flush and coplanar with exposed surfaces of the second semiconductor layers 104 and sidewalls of the gate spacers. However, the disclosure is not limited thereto. In some alternative embodiments, the exposed surfaces of the inner spacers 136 are dented from the exposed surfaces of the second semiconductor layers 104 and sidewalls of the gate spacers.

A material of the insulating material for forming the inner spacers 136 may include silicon oxide, silicon nitride, silicon carbide, silicon carbide nitride, silicon oxide carbide, silicon carbide oxynitride, or other suitable dielectric materials or combinations thereof. A method for forming the inner spacers 136 may include initially forming an insulating material layer globally covering the structure shown in FIG. 1F, and then removing portions of the insulating material layer outside the recesses 134. In this way, the remained portions of the insulating material layer form the inner spacers 136. In some embodiments, the insulating material layer is formed by using a deposition process (e.g., a CVD process or an ALD process), and the portions of the insulating material layer are removed by using an etching process (e.g., an anisotropic etching process).

Figure 1H:
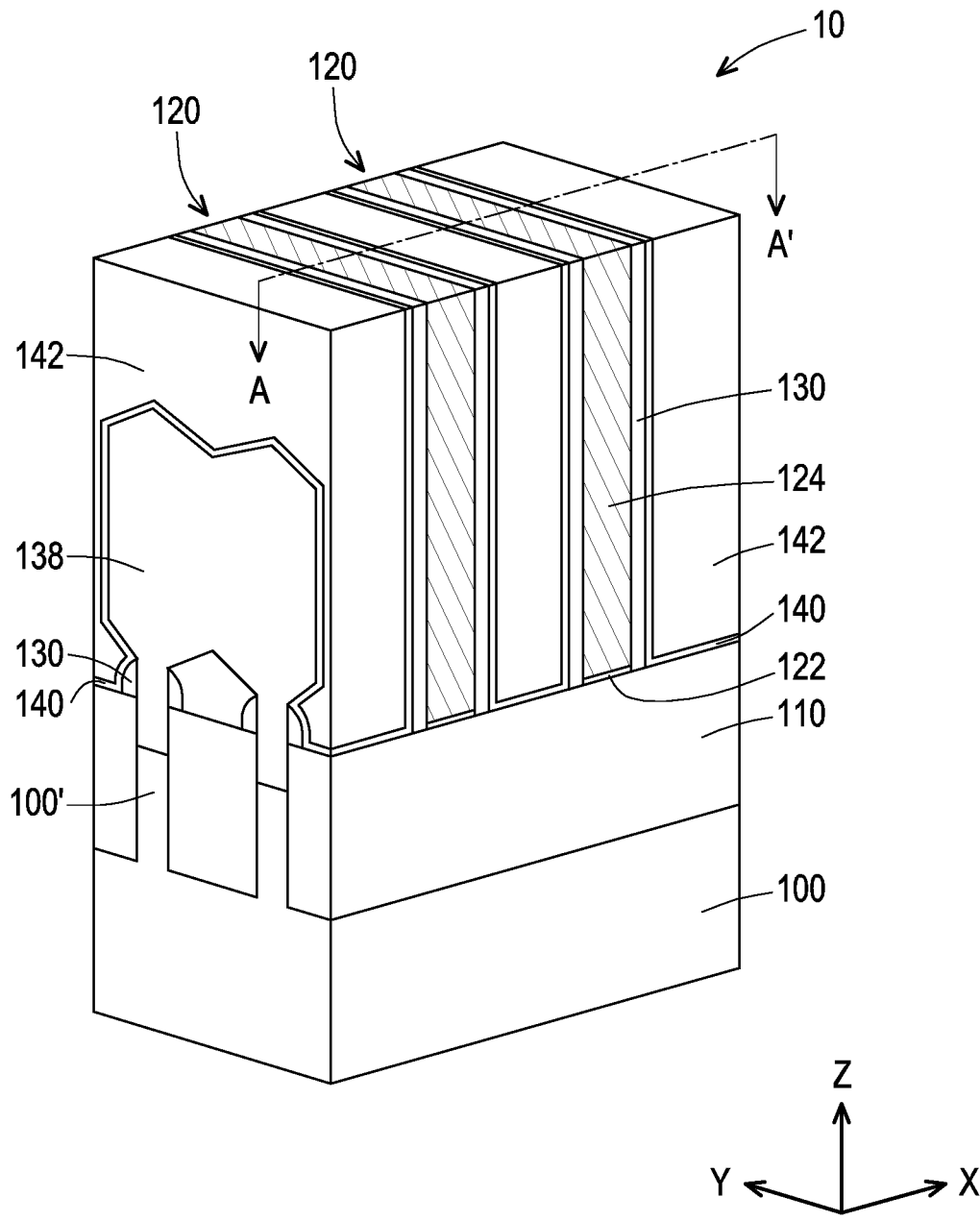

Referring to FIG. 1H and FIG. 2A, S/D electrodes 138 are formed from the recesses 132 (in FIG. 1G). The sacrificial gate structures 120 are respectively located between a pair of the S/D electrodes 138, and are separated from the S/D electrodes 138 by the gate spacers. In addition, the second semiconductor layers 104 and the inner spacers 136 covered by each sacrificial gate structure 120 are in lateral contact with a pair of the S/D electrodes 138. In the embodiment shown in FIG. 1H and FIG. 2A, the top surfaces of the S/D electrodes 138 are higher than the top surface of the stacking structure of the first and second semiconductor layers 102, 104 (i.e., the top surface of the topmost second semiconductor layer 104). However, the disclosure is not limited thereto. In some alternative embodiments, the top surfaces of the S/D electrodes 138 are substantially coplanar with the top surface of the stacking structure of the first and second semiconductor layers 102, 104.

The S/D electrodes 138 may include a semiconductor material such as silicon (Si) or germanium (Ge); a compound semiconductor such as silicon germanium (SiGe), silicon carbide (SiC), silicon phosphide (SiP), silicon phosphide carbide (SiCP), gallium arsenide (GaAs), gallium phosphide (GaP), indium phosphide (InP), indium arsenide (InAs), indium antimonide (InSb); an alloy semiconductor such GaAsP, AlInAs, AlGaAs, InGaAs, GaInP, and/or GaInAsP; or combinations thereof. For example, the S/D electrodes 138 includes one or more layers of Si, SiP, SiC and SiCP for an n-channel FET or Si, SiGe, Ge for a p-channel FET.

In some embodiments, the S/D electrodes 138 are formed by an epitaxial process. In these embodiments, the S/D electrodes 138 may be grown from the fin substrates 100' exposed by the recesses 132. The epitaxy process may include CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy, other suitable SEG processes, or combinations thereof. In some embodiments, the S/D electrodes 138 merge above the isolation structure 110, as shown in FIG. 1H. It is noted that the present disclosure is not limited to the shapes of the S/D electrodes 138 shown in FIG. 1H, and the S/D electrodes 138 may be actually formed as other shapes.

Still referring to FIG. 1H and FIG. 2A, a liner layer 140 and an interlayer dielectric (ILD) layer 142 are formed over the semiconductor device 10. The liner layer 140 may include any suitable dielectric material, such as SiO, SiON, SiN, SiCN, SiOC, SiOCN, and may be formed by any suitable method, such as ALD, CVD, PVD, other suitable methods, or combinations thereof. The liner layer 140 functions as a contact etch stop layer (CESL) in the subsequent etching operations. As illustrated in FIG. 1H and FIG. 2A, the liner layer 140 is conformally formed over the isolation structure 110. In detail, as shown in FIG. 1H and FIG. 2A, the liner layer 140 is disposed along the gate spacers and covers the S/D electrodes 138. In other words, the liner layer 140 has a conformal profile over the S/D electrodes 138 (e.g., having about the same thickness on outer surfaces of S/D electrodes 138). In some embodiments, the liner layer 140 has a thickness of about 1 nm to 10 nm. The ILD layer 142 is formed over the liner layer 140. The ILD layer 142 includes a low-k dielectric material, such as tetraethylorthosilicate (TEOS), un-doped silicate glass, or doped silicon oxide (SiO) such as borophosphosilicate glass (BPSG), fused silica glass (FSG), phosphosilicate glass (PSG), boron doped silicon glass (BSG), other suitable dielectric materials, or combinations thereof. The ILD layer 142 may include a multi-layer structure having multiple dielectric materials. The ILD layer 142 may be formed by a deposition process such as CVD, FCVD, spin-on-glass (SOG), other suitable methods, or combinations thereof.

Further, still referring to FIG. 1H and FIG. 2A, after the ILD layer 142 is formed, a planarization operation, such as CMP, is performed to planarize the top surface of the semiconductor device 10. As illustrated in FIG. 1H and FIG. 2A, during the planarization operation, the capping structures 126 of the sacrificial gate structures 120 are removed, so that the sacrificial gate electrodes 124 are exposed.

Figure 2B:
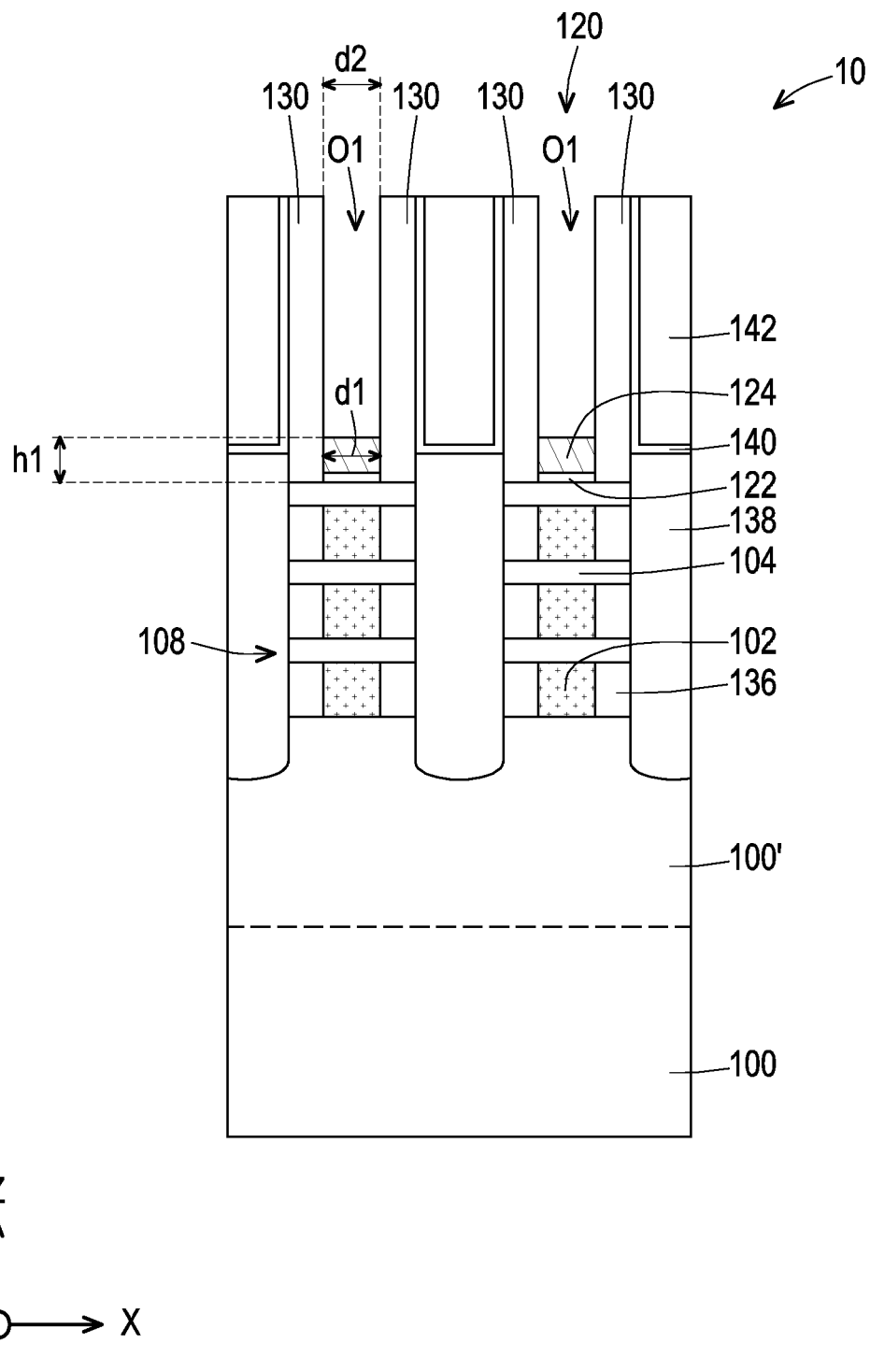

Referring to FIG. 2B, portions of the sacrificial gate electrodes 124 are removed, so as to form gate trenches O1 each between the corresponding sidewall spacers 130 (i.e., gate spacers). In some embodiments, the sacrificial gate electrodes 124 are removed by etching process. The etching process includes dry etching, wet etching, other etching methods, or combinations thereof. As shown in FIG. 2B, during the removing process, the sidewall spacers 130 remain substantially intact while the sacrificial gate electrodes 124 are partially removed. This is because the specific etching selectivity is chosen based on the material differences between the sidewall spacers 130 and the sacrificial gate electrodes 124. In some embodiments, for the etchant used in the removing process of the sacrificial gate electrodes 124, the etching selectivity of the material of the sidewall spacers 130 to the material of the sacrificial gate electrodes 124 is larger than about 100. As shown in FIG. 2B, after the removing process is performed, portions of the sidewall spacers 130 and the top surfaces of the remaining sacrificial gate electrodes 124 are exposed by the gate trenches O1. In other words, the gate trench O1 is defined by the sidewall spacers 130 and the remaining sacrificial gate electrodes 124. In some embodiments, a height h1 measured from the top surface of the fin structure 108 (i.e., the top surface of the topmost second semiconductor layer 104) to the top surface of the remaining sacrificial gate electrode 124 located at bottom of the gate trench O1 along the vertical direction Z ranges from about 5 nm to about 15 nm. Since the gate trenches O1 are formed by partially removing the sacrificial gate electrodes 124 with the sidewall spacers 130 being substantially intact, the dimension d2 of each of the gate trenches O1 along the first direction X is substantially equal to the dimension d1 of the corresponding remaining sacrificial gate electrode 124 along the first direction X. That is to say, the lateral dimension d2 of each of the gate trenches O1 is substantially equal to the lateral dimension d1 of the corresponding remaining sacrificial gate electrode 124.

Figure 2C:
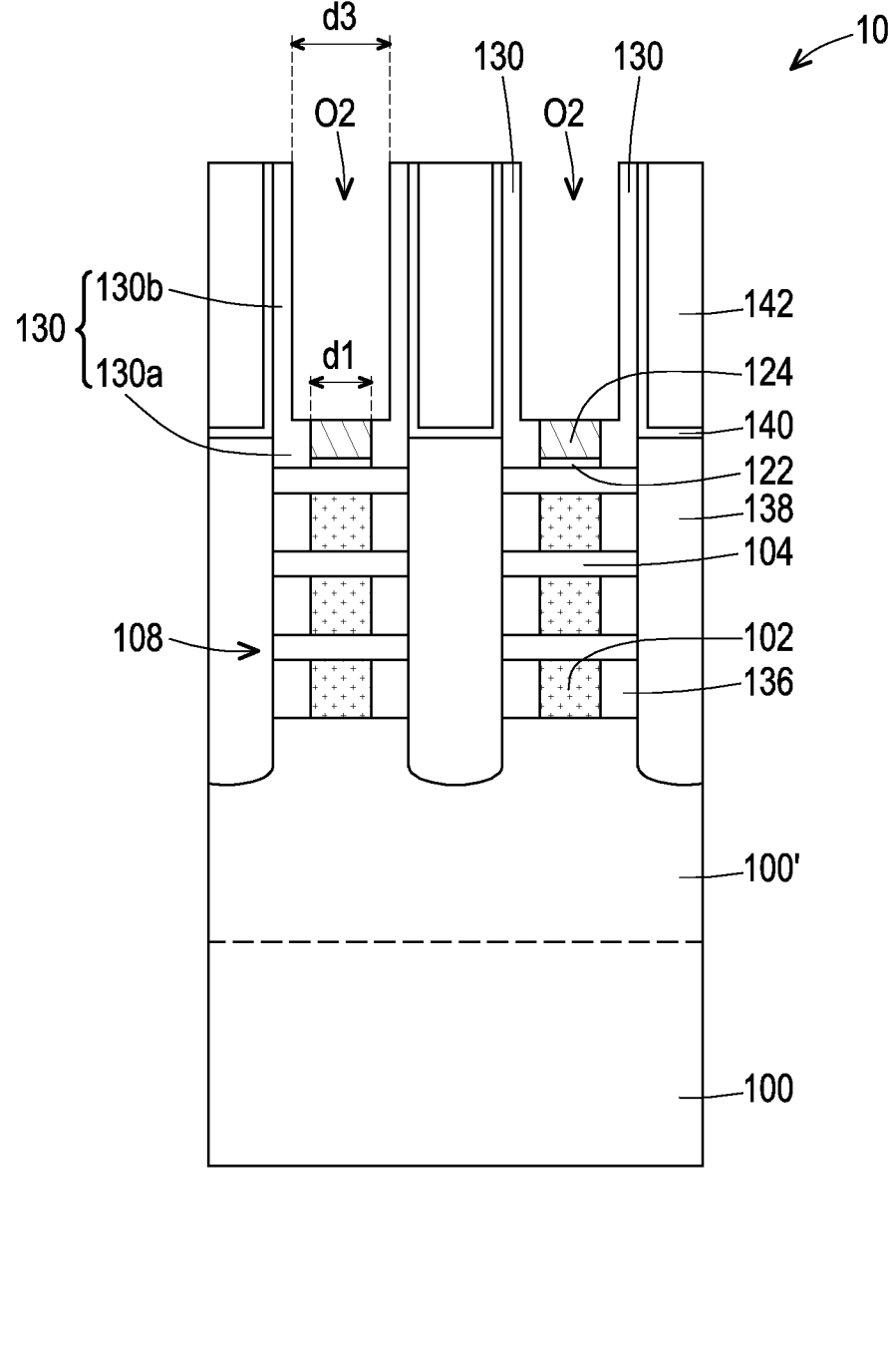

Referring to FIG. 2C, after the sacrificial gate electrodes 124 are partially removed, portions of the sidewall spacers 130 exposed by the gate trenches O1 are removed. As shown in FIG. 2C, the portions of the sidewall spacers 130 exposed by the gate trenches O1 are laterally removed. In some embodiments, the sidewall spacers 130 are removed by etching process. The etching process includes dry etching, wet etching, other etching methods, or combinations thereof. In some embodiments, an amount of lateral etchback of the sidewall spacers 130 ranges from about 2 nm to about 10 nm. As shown in FIG. 2C, during the removing process, the sacrificial gate electrodes 124 remain substantially intact while the sidewall spacers 130 are partially removed. This is because the specific etching selectivity is chosen based on the material differences between the sidewall spacers 130 and the sacrificial gate electrodes 124. In some embodiments, for the etchant used in the removing process of the sidewall spacers 130, the etching selectivity of the material of the sidewall spacers 130 to the material of the sacrificial gate electrodes 124 is larger than about 100.

As shown in FIG. 2B and FIG. 2C, the removing process (e.g., etching process) of the sidewall spacers 130 extends each of the previously gate trenches O1 into at least portions of the corresponding sidewall spacers 130 forming an extended gate trench O2. That is to say, the decrease in dimension (e.g., width) along first direction X of each of the sidewall spacers 130 may provide a widening of gate trenches O1 that allows for improved trench fill of work function metal layer subsequently formed. In other words, as illustrated in FIG. 2C, the gate trenches O2 are formed that extend into the sidewall spacers 130. Since the gate trenches O2 are formed by partially and laterally removing the sidewall spacers 130, the dimension d3 of each of the gate trenches O2 along the first direction X is greater than the dimension d1 of the corresponding sacrificial gate electrode 124 along the first direction X. In some embodiments, the difference between the dimension d3 of the gate trench O2 and the dimension d1 of the corresponding sacrificial gate electrode 124 ranges from about nm to about 20 nm.

As shown in FIG. 2C, after the gate trenches O2 are formed, each of the sidewall spacers 130 becomes to have a first portion 130a and a second portion 130b located on the first portion 130a, wherein a dimension (e.g., thickness) along first direction X of the first portion 130a is greater than a dimension (e.g., thickness) along first direction X of the second portion 130b. That is to say, the first portion 130a is thicker than the second portion 130b. In some embodiments, the top surface of the first portion 130a is substantially flush and coplanar with the top surface of the corresponding sacrificial gate electrode 124, as shown in FIG. 2C. However, the disclosure is not limited thereto. In some alternative embodiments, a portion of the first portion 130a exposed by the corresponding gate trench O2 is slightly removed (etched). In some embodiments, the first portion 130a is directly in contact with the corresponding sacrificial gate electrode 124, and the second portion 130b is disposed over the corresponding sacrificial gate electrode 124 and exposed by the corresponding gate trench O2. In some embodiments, sufficient thickness of the second portions 130b should be maintained to protect the gate structures subsequently formed.

Figure 2D:
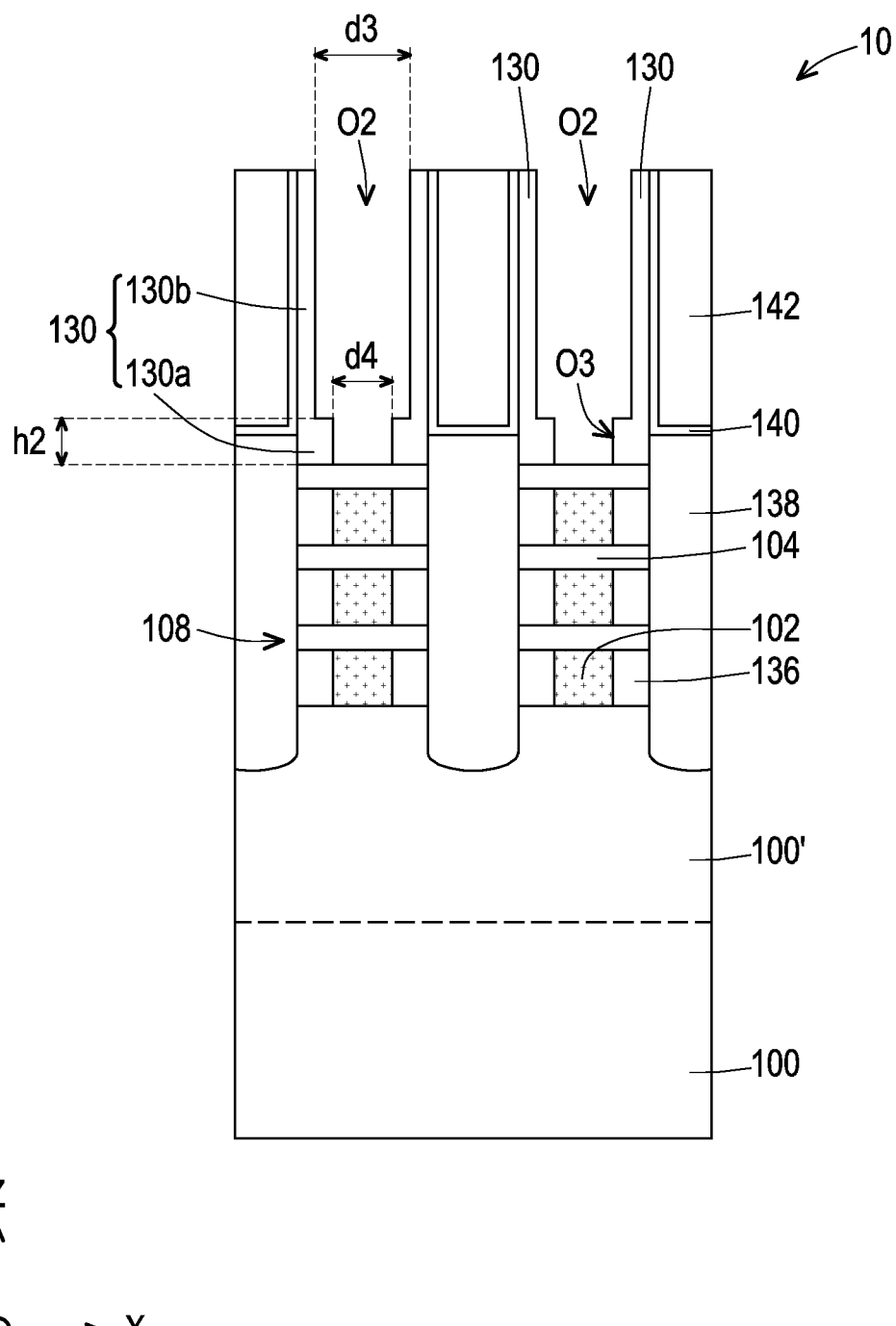

Referring to FIG. 2D, after the gate trenches O2 are formed, the sacrificial gate electrodes 124 and the sacrificial gate dielectric layers 122 under the gate trenches O2 are removed, so as to form gate trenches O3 each between the corresponding first portions 130a of the sidewall spacers 130. In some embodiments, the sacrificial gate electrodes 124 and the sacrificial gate dielectric layers 122 are removed by one or more etching processes, such as wet etching, dry etching, reactive-ion etching (RIE), or other etching techniques. In some embodiments, when the sacrificial gate electrodes 124 are made of polysilicon and the sacrificial gate dielectric layers 122 are made of silicon oxide, a wet etchant such as a tetramethylammonium hydroxide (TMAH) solution can be used to selectively remove the sacrificial gate electrodes 124. The sacrificial gate dielectric layers 122 are thereafter removed using dry etching and/or wet etching. As shown in FIG. 2D, after the removing process is performed, the first portions 130a of the sidewall spacers 130 and the top surfaces of the top surfaces of the fin structures 108 (i.e., the top surfaces of the topmost second semiconductor layers 104) are exposed by the gate trenches O3. In other words, the gate trench O3 is defined by the lower portions of the sidewall spacers 130 and the fin structures 108.

As shown in FIG. 2D, during the removing process, the sidewall spacers 130 (including the first portions 130a and the second portions 130b) remain substantially intact while the sacrificial gate electrodes 124 and the sacrificial gate dielectric layers 122 are removed. This is because the specific etching selectivity is chosen based on the material differences between the sidewall spacers 130 and the sacrificial gate electrodes 124, as described above. Also, the specific etching selectivity is chosen based on the material differences between the sidewall spacers 130 and the sacrificial gate dielectric layers 122. In some embodiments, for the etchant used in the removing process of the sacrificial gate dielectric layers 122, the etching selectivity of the material of the sidewall spacers 130 to the material of the sacrificial gate dielectric layers 122 is larger than about 50.

Since the gate trenches O3 are formed by removing the sacrificial gate electrodes 124 remaining after the gate trenches O1 are formed (in FIG. 2B) and the sacrificial gate dielectric layers 122 below the said sacrificial gate electrodes 124, the depth h2 of each of the gate trenches O3 along the vertical direction Z is substantially equal to the height h1, and the dimension d4 of each of the gate trenches O3 along the first direction X is substantially equal to the dimension d1. As such, along the first direction X, the gate trench O2 is wider than the gate trench O3. In some embodiments, the difference between the dimension d3 of the gate trench O2 and the dimension d4 of the corresponding gate trench O3 ranges from about 5 nm to about 20 nm. As shown in FIG. 2D, the gate trench O3 is located below the corresponding gate trench O2 and communicated with the corresponding gate trench O2. As such, the gate trench O3 and the gate trench O2 may be collectively considered as one gate trench with a lower portion and a upper portion wider than the lower portion along the first direction X. Form another point of view, the gate trench O3 and the gate trench O2 may collectively form one gate trench having a T-shaped cross-section. That is to say, by performing the step of partially removing the sacrificial gate electrodes 124, the step of partially removing the sidewall spacers 130 with respect to the remaining sacrificial gate electrodes 124, and the step of removing the remaining sacrificial gate electrodes 124 and the sacrificial gate dielectric layers 122, gate trenches each having a T-shaped cross-section are formed over the fin structures 108.

Figure 2E:
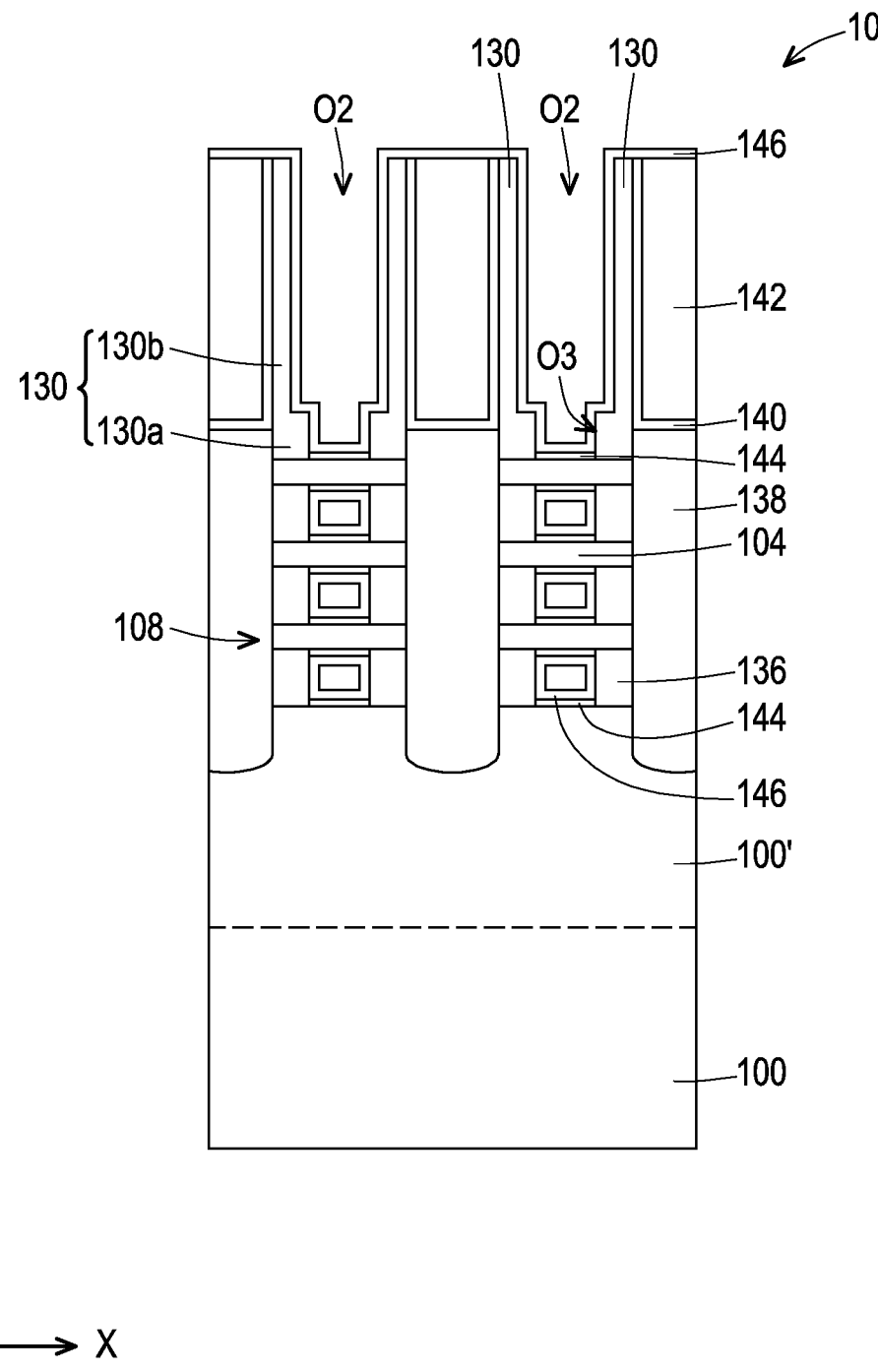

Referring to FIG. 2E, after the gate trenches O3 are formed, a channel release process is performed, such that the first semiconductor layers 102 are removed from the gate trenches O3 and gate trenches O2. As a result, the second semiconductor layers 104 are suspended in the channel regions of the fin structures 108. The suspended second semiconductor layers 104 are collectively referred to as a nanostructure. In some embodiments, the second semiconductor layers 104 are slightly etched or not etched depending on the design of the semiconductor device 10. For example, the second semiconductor layers 104 may be slightly etched to form a wire-like shape (for nanowire transistors); the second semiconductor layers 104 may be slightly etched to form a sheet-like shape (for nanosheet transistors); or the second semiconductor layers 104 may be slightly etched to form other geometrical shape (for other nanostructure transistors). In addition, inner sidewalls of the inner spacers 136 previously covered by the first semiconductor layers 102 are currently exposed in the gate trenches O3 and gate trenches O2.

In some embodiments, the first semiconductor layers 102 are removed by a selective etching process that is tuned to remove only the first semiconductor layers 102 while the second semiconductor layers 104 and the inner spacers 136 remain substantially unchanged. The selective etching may be a selective wet etching, a selective dry etching, or a combination thereof. The selective etching may be performed by properly selecting etchants for the etching process and/or properly selecting the materials of the first semiconductor layers 102 and the second semiconductor layers 104. In some embodiments, the selective wet etching process may include a HF or $NH_4OH$ etchant. In some embodiments, the selective removal of first semiconductor layers 102 may include an oxidation process (for example, to form oxidized semiconductor layers 210A comprising SiGeOx) followed by an oxidation removal (for example, SiGeOx removal).

Still referring to FIG. 2E, after the first semiconductor layers 102 are removed, a gate interfacial layer 144 wrapping the second semiconductor layers 104 and a gate dielectric layer 146 over the gate interfacial layer 144 are formed. The gate interfacial layer 144 and the gate dielectric layer 146 collectively refer to as gate dielectric.

The gate interfacial layer 144 may include materials such as $SiO_2$, SiON, HfSiO, other suitable materials, or combinations thereof. A deposition process may be performed to form the gate interfacial layer 144 wrapping around the suspended second semiconductor layers 104. The deposition process includes CVD, PVD, ALD, HDPCVD, MOCVD, RPCVD, PECVD, LPCVD, ALCVD, APCVD, other suitable methods, or combinations thereof. In some embodiments, the gate interfacial layer 144 is only deposited on the Si material, not the dielectric material, such as the isolation structure 110. In some embodiments, a thickness of the gate interfacial layer 144 ranges from about 0.5 nm to about 1.5 nm.

The gate dielectric layer 146 may be a high-k dielectric layer and include materials such as hafnium oxide ($HfO_2$), hafnium silicon oxide (HfSiO), hafnium zirconium oxide (HfZrO), zirconium oxide ($ZrO_2$), other suitable materials, or combinations thereof. The gate dielectric layer 146 is deposited over the gate interfacial layer 144 to wrap the suspended second semiconductor layers 104 by a suitable deposition process, such as CVD, PVD, ALD, HDPCVD, MOCVD, RPCVD, PECVD, LPCVD, ALCVD, APCVD, plating, other suitable methods, or combinations thereof. In one embodiment, the gate dielectric layer 146 is formed using a highly conformal deposition process such as ALD in order to ensure the gate dielectric layer 146 having a uniform thickness around each second semiconductor layer 104 (i.e., channel layer). In some embodiments, a thickness of the gate interfacial layer 144 ranges from about 1 nm to about 2 nm. In some embodiments, the gate dielectric layer 146 is formed to lining on the exposed surfaces over the substrate 100. As shown in FIG. 2E, the gate dielectric layer 146 is disposed in the spaces between the second semiconductor layers 104, disposed on the sidewalls of the gate trenches O3 and gate trenches O2, for example, on the exposed surfaces of the sidewall spacers 130 and the gate interfacial layer 144 on the top surfaces of the fin structures 108, and also deposited over the upper surfaces of the liner layer 140 and the ILD layer 142.

Figure 2F:
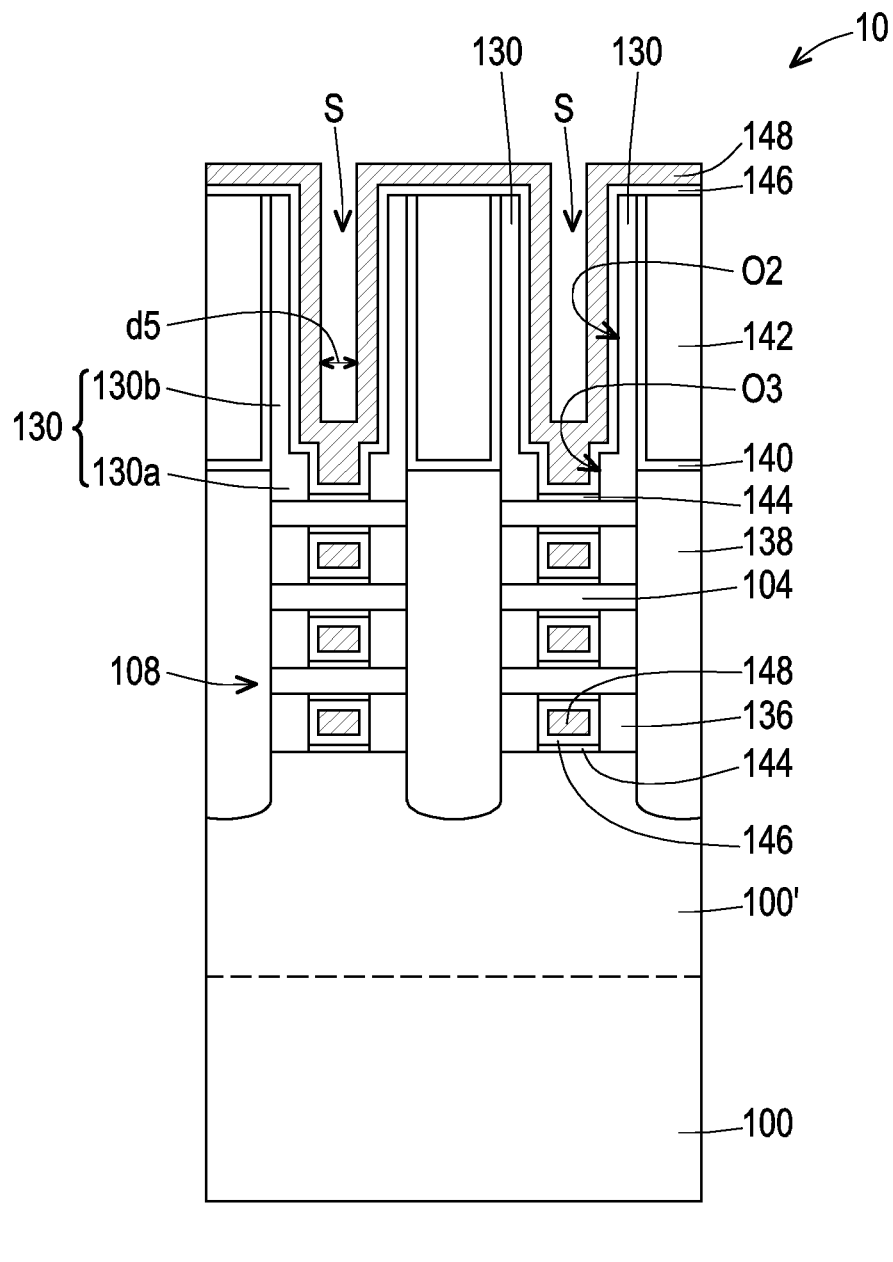
Figure 2F:
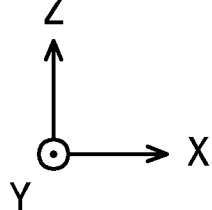

Referring to FIG. 2F, a work function metal layer 148 is formed over the gate dielectric layer 146. In some embodiments, the work function metal layer 148 includes any suitable conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the work function metal layer 148 is formed by a deposition process (e.g., a CVD process or an ALD process), a plating process (e.g., an electrical plating process or an electroless plating process) or other suitable method. In some embodiments, a thickness of the work function metal layer 148 ranges from about 1 nm to about 10 nm.

In some embodiments, the work function metal layer 148 wraps around each of the suspended second semiconductor layers 104 in the channel region of the fin structures 108. As shown in FIG. 2F, the work function metal layer 148 fills the spaces between the second semiconductor layers 104. In some embodiments, the gate interfacial layer 144 and the gate dielectric layer 146 collectively are referred to as gate dielectric of the semiconductor device 10, and the work function metal layer 148 is referred to as gate electrode of the semiconductor device 10. As such, the semiconductor device 10 can be referred to as a gate all around FET (GAA FET), because the gate electrode (e.g., the work function metal layer 148) surrounds the second semiconductor layers 104 (i.e., the channel layers), and the second semiconductor layers 104 are physically separated from the work function metal layer 148 by the gate dielectric (e.g., including the gate interfacial layer 144 and the gate dielectric layer 146).

In some embodiments, the work function metal layer 148 is conformally formed in the gate trenches O3 and the gate trenches O2. As shown in FIG. 2F, the work function metal layer 148 is disposed on the gate dielectric layer 146 in the gate trenches O3 and the gate trenches O2. Since the gate trench O2 over the gate trench O3 is formed widening, during the formation of the work function metal layer 148, the work function metal layer 148 is efficiently filled into the gate trench O3, such that the work function metal layer 148 merges in the gate trench O3, while rendering a space S defined by the work function metal layer 148 in the gate trench O2. In some embodiments, as shown in FIG. 2F, the work function metal layer 148 also merges in lower portion of the gate trench O2. Form another point of view, after the work function metal layer 148 is formed, the work function metal layer 148 is filled up the lower portion of the T-shaped gate trench, while partially filled the upper portion of the T-shaped gate trench. In some embodiments, along the first direction X, the space S has a dimension d5 at least greater than about 2 nm. In some embodiments, as shown in FIG. 2F, the work function metal layer 148 is also deposited over the top surfaces of the liner layer 140 and the ILD layer 142.

Figure 2G:
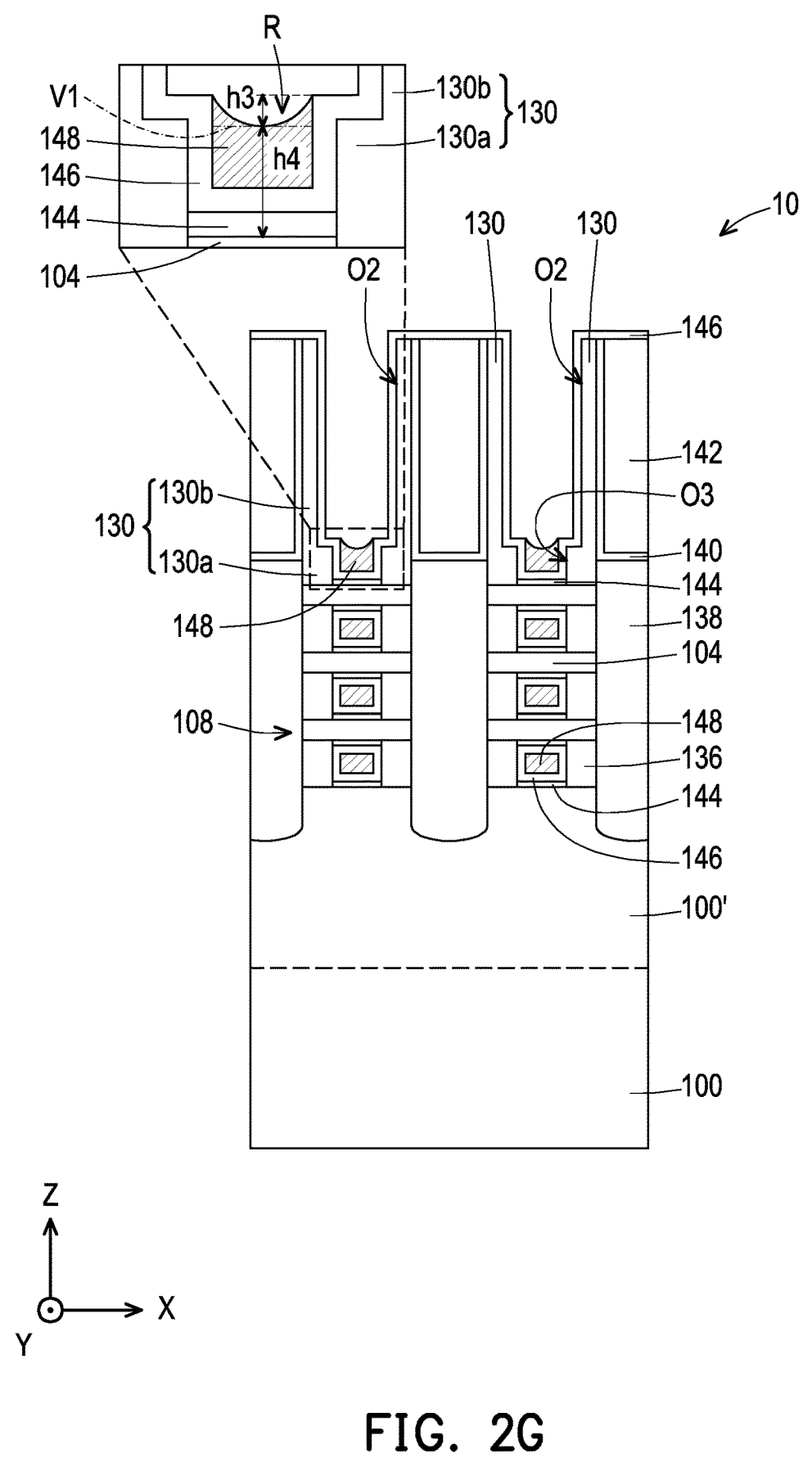

Referring to FIGS. 2F and 2G, a pulling back process is performed on the work function metal layer 148 to remove portions of the work function metal layer 148 that do not merge. For example, as shown in FIG. 2G, portions of the work function metal layer 148 that are located on the second portions 130b and on the top surfaces of the liner layer 140 and the ILD layer 142 are removed. In some embodiments, the pulling back process includes etching process. In some embodiments, the pulling back process includes a wet etching process using an oxidant-containing solution containing hydrogen peroxide ($H_2O_2$).

It is noted that the merged portions of the work function metal layer 148 can sustain the pulling back process, such that during the pulling back process, the merged portions of the work function metal layer 148 remain over the fin structures 108. As such, the pulling back process of the work function metal layer 148 can also be referred to as a self-aligned gate electrode formation process. In view of this, in the manufacturing method of the semiconductor device 10, by forming the T-shaped gate trench (including the gate trench O2 and the gate trench O3) to render the work function metal layer 148 merging, it is possible to precisely control the height of the gate electrode, minimize the height variation of the gate electrode, and reduce cost. Further, by forming the gate trench O3 with the depth h2 ranging about 5 nm to about 15 nm, the gate electrode can be formed with effective gate height. As such, the issue of arising large parasitic capacitance due to a high gate height can be minimized, and thereby the electrical performance of the semiconductor device 10 is improved. In some embodiments, the height variation of the gate electrode is less than about 5 nm.

In some embodiments, as shown in FIGS. 2F and 2G, the merged portions of the work function metal layer 148 are partially removed during the pulling back process, and thus are mainly located in the gate trenches O3. As such, each of the merged portions of the work function metal layer 148 is located between the first portions 130a of the corresponding sidewall spacers 130. Further, in some embodiments, during the pulling back process, the merged portions of the work function metal layer 148 are slightly removed to form a recess R on each top thereof, as shown in FIG. 2G. In some embodiments, the depth h3 of the recess R along the vertical direction Z is in a range of greater than 0 nm to about 5 nm. In some embodiments, a height h4 measured from the top surface of the fin structure 108 (i.e., the top surface of the topmost second semiconductor layer 104) to a virtual plane V1 parallel with the first direction X and where the vertex point of the bottom surface of the recess R is located on along the vertical direction Z ranges from about 6 nm to about 15 nm. In addition, due to the space S is rendered in the gate trench O2 after forming the work function metal layer 148, the work function metal layer 148 that do not merge can be effectively removed. For example, in some embodiments where the pulling back process includes a wet etching process, through the space S, the wet etchant solution can be effectively in contact with the portions of the work function metal layer 148 to be removed.

Figure 2H:
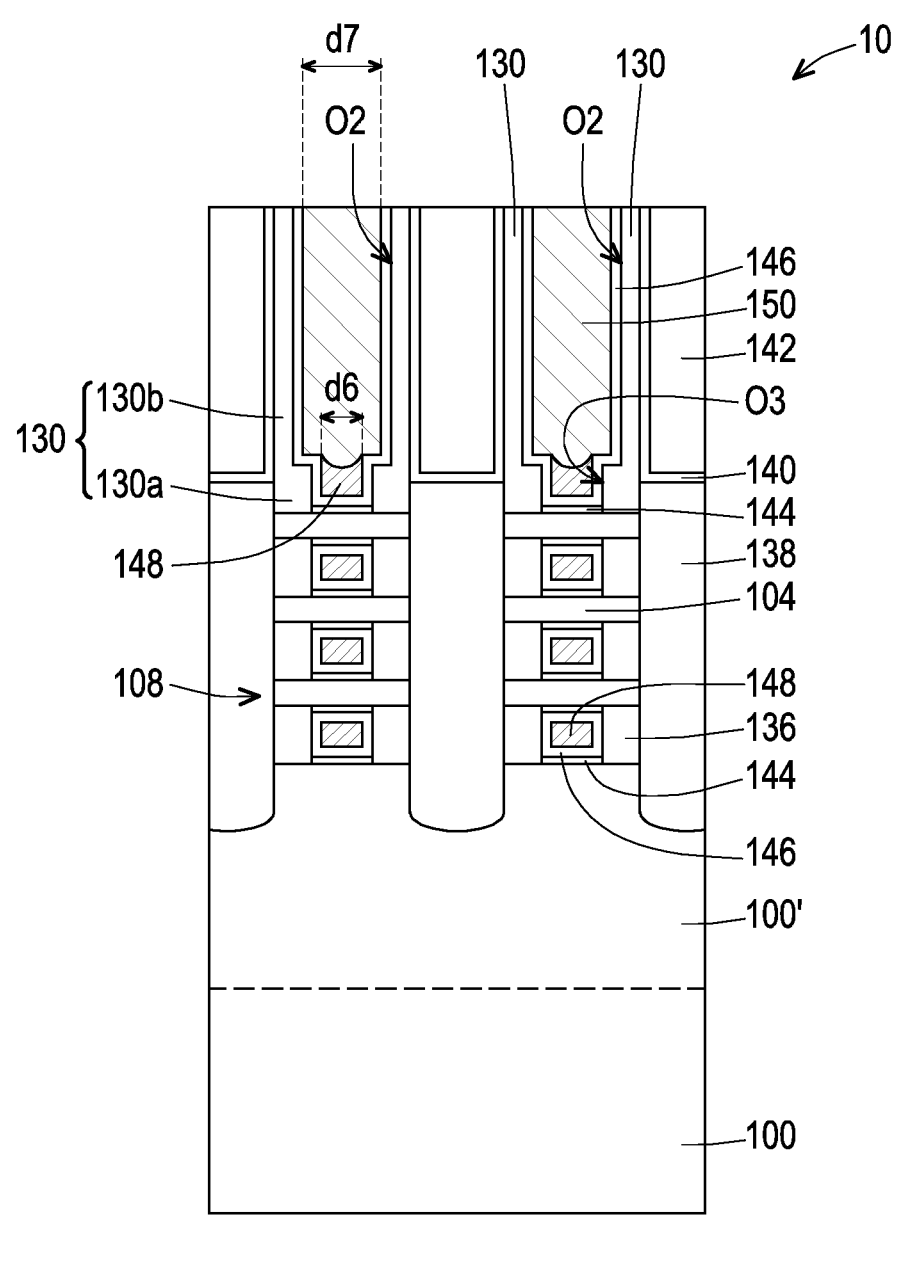
Figure 2H:
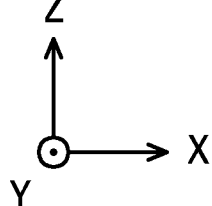

Referring to FIG. 2H, after the pulling back process is performed, a work function metal layer 150 is formed over the work function metal layer 148 and in the gate trenches O2. In some embodiments, the work function metal layer 150 includes conductive material with low resistance, such as W, TiN, Cu, other suitable materials, and/or combinations thereof. In some embodiments, the formation of the work function metal layer 150 includes forming a conductive material layer over the work function metal layer 148 to fill the recesses R and the gate trenches O2 and cover the top surfaces of the liner layer 140 and the ILD layer 142. The conductive material layer is formed by a deposition process (e.g., a CVD process or an ALD process), a plating process (e.g., an electrical plating process or an electroless plating process) or other suitable method. Then, a planarization operation, such as a CMP method and/or an etch-back method, is performed such that the top surfaces of the liner layer 140 and the ILD layer 142 are revealed. In some embodiments, the gate interfacial layer 144, the gate dielectric layer 146, the work function metal layer 148 and the work function metal layer 150 collectively are referred to as gate structure of the semiconductor device 10. Since the work function metal layer 148 fills the gate trench O3 and the work function metal layer 150 fills the gate trenches O2, the dimension d7 of each of the work function metal layer 150 along the first direction X is greater than the dimension d6 of the work function metal layer 148 along the first direction X. As illustrated in FIG. 2H, the work function metal layer 150 is formed in the gate trenches O2 such that the remaining portions of the gate trenches O2 are completed filled with the work function metal layer 150, therefore the work function metal layer 150 also referred to as a gate fill metal layer.

As shown in FIG. 2H, in the semiconductor device 10, the gate electrode is constituted by one work function metal layer 148. However, the disclosure is not limited thereto. In some alternative embodiments, the gate electrode may be constituted by more than one work function metal layer in order to achieve a desired threshold voltage. Hereinafter, other embodiments will be described with reference to FIG. 3.

Figure 3:
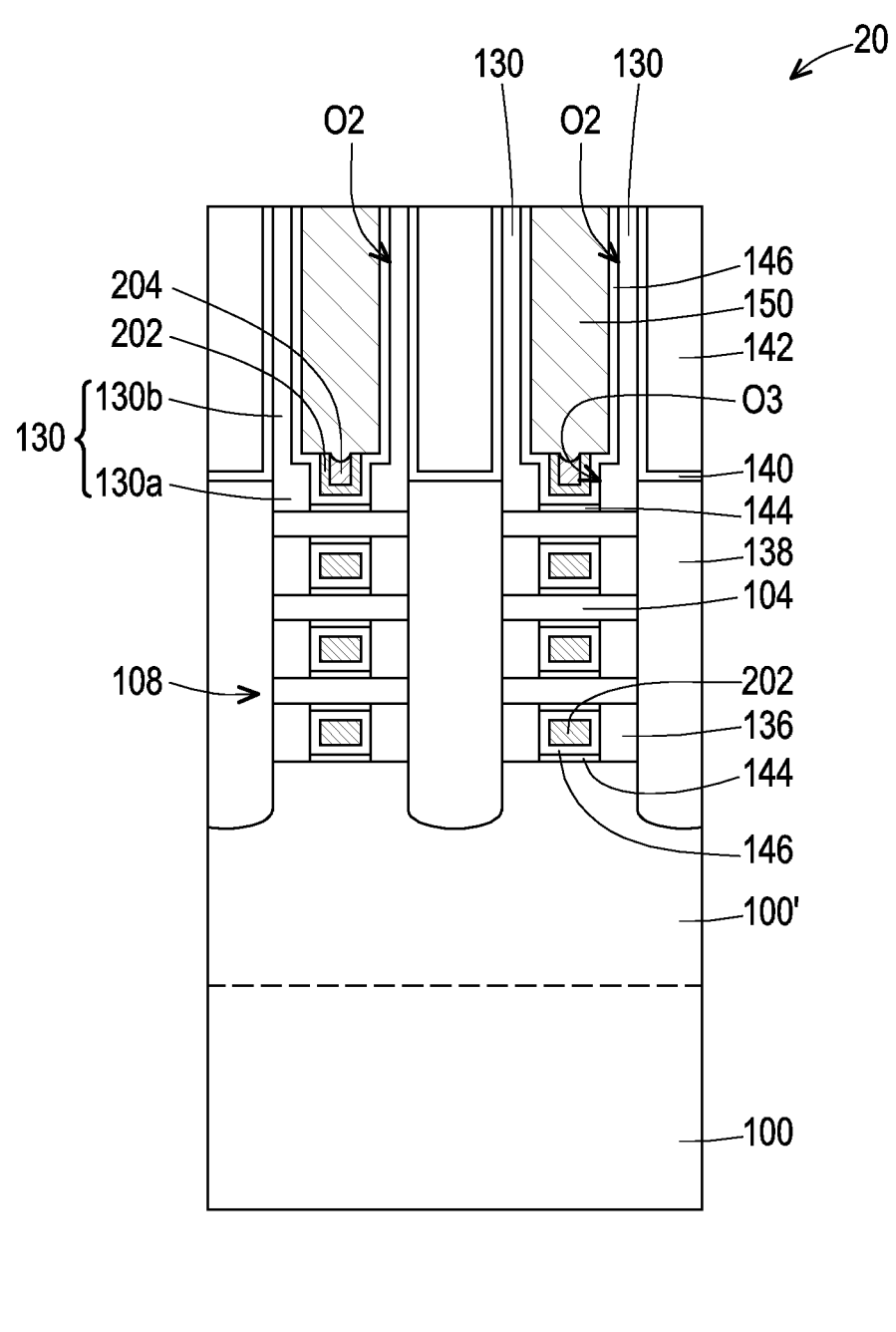
FIG. 3 illustrates a schematic cross-sectional view of a semiconductor device in accordance with some alternative embodiments of the disclosure.

FIG. 3 illustrates a schematic cross-sectional view of a semiconductor device in accordance with some alternative embodiments of the disclosure. The semiconductor device 20 illustrated in FIG. 3 is similar to the semiconductor device 10 illustrated in FIG. 2H, hence the same reference numerals are used to refer to the same or liked parts, and its detailed description will be omitted herein. The differences between the semiconductor device 20 and the semiconductor device 10 lies in that in the semiconductor device 20, the gate electrode is constituted by two work function metal layers 202 and 204. Furthermore, according to the descriptions with respect to FIGS. 1A-1H and FIGS. 2A-2H, those skilled in the art should understand that the semiconductor device 20 may be manufactured following the method described above in conjunction with FIGS. 2F-2H, except that after the gate dielectric layer 146 is formed, two work function metal layers (i.e., the work function metal layer 202 and the work function metal layer 204) are sequentially formed over the gate dielectric layer 146. In some embodiments, each of the work function metal layer 202 and the work function metal layer 204 includes any suitable conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the material of the work function metal layer 202 is different from that of the work function metal layer 204. In some embodiments, each of the work function metal layer 202 and the work function metal layer 204 is formed by a deposition process (e.g., a CVD process or an ALD process), a plating process (e.g., an electrical plating process or an electroless plating process) or other suitable method. In some embodiments, a thickness of each of the work function metal layer 202 and the work function metal layer 204 ranges from about 1 nm to about 10 nm. As shown in FIG. 3, only the work function metal layer 202 fills the spaces between the second semiconductor layers 104. However, the disclosure is not limited thereto. In some alternative embodiments, both of the work function metal layer 202 and the work function metal layer 204 fill the spaces between the second semiconductor layers 104.

As shown in FIG. 2H, in the semiconductor device 10, the gate structure is constituted by the gate interfacial layer 144, the gate dielectric layer 146, the work function metal layer 148 and the work function metal layer 150. However, the disclosure is not limited thereto. In some alternative embodiments, the gate structure may include other suitable layers. Hereinafter, other embodiments will be described with reference to FIG. 4 and FIG. 5.

Figure 4:
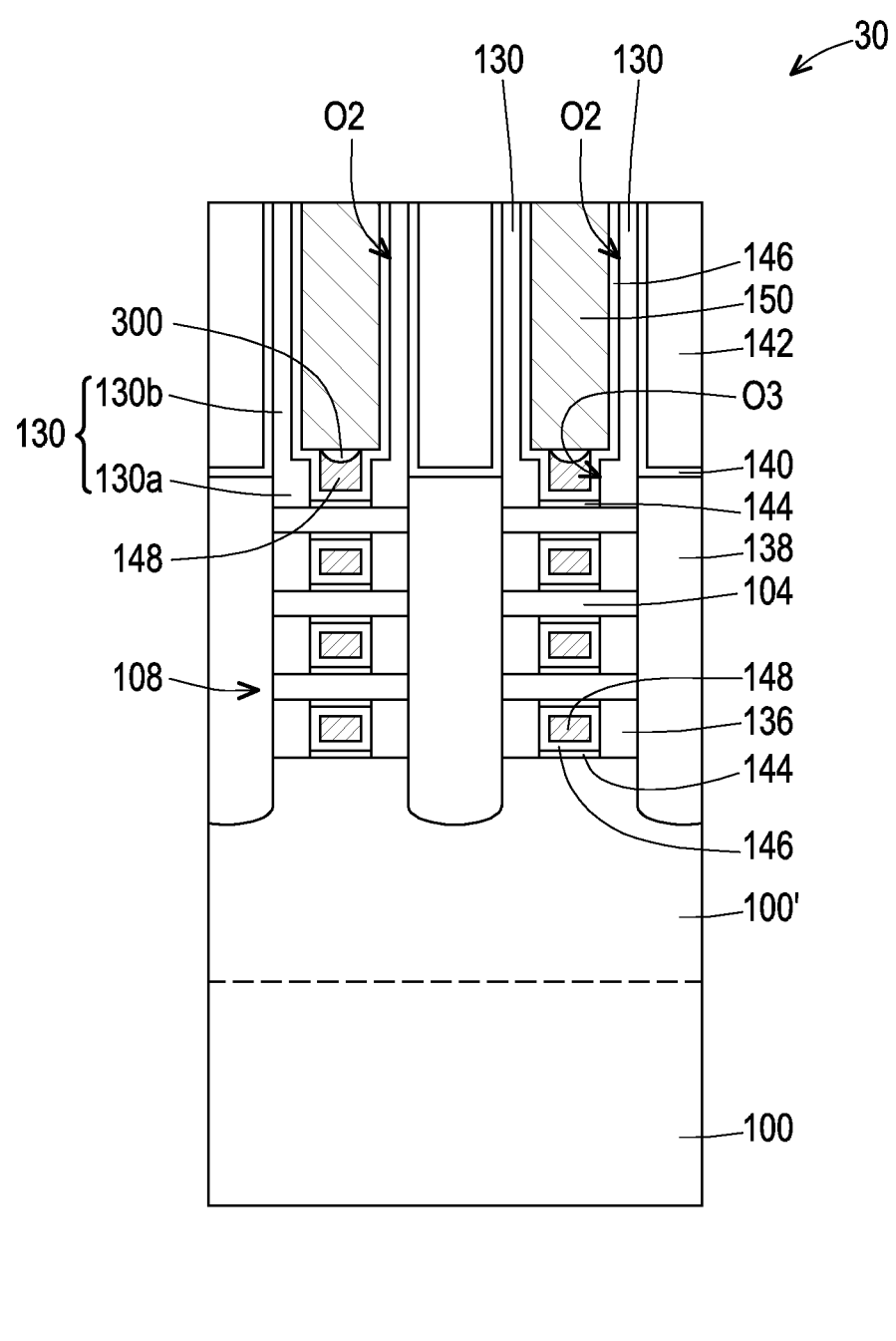
FIG. 4 illustrates a schematic cross-sectional view of a semiconductor device in accordance with some alternative embodiments of the disclosure.

FIG. 4 illustrates a schematic cross-sectional view of a semiconductor device in accordance with some alternative embodiments of the disclosure. The semiconductor device illustrated in FIG. 4 is similar to the semiconductor device 10 illustrated in FIG. 2H, hence the same reference numerals are used to refer to the same or liked parts, and its detailed description will be omitted herein. The differences between the semiconductor device 30 and the semiconductor device 10 lies in that in the semiconductor device 30, a work function metal layer 300 is formed to fill the recesses R. Furthermore, according to the descriptions with respect to FIGS. 1A-1H and FIGS. 2A-2H, those skilled in the art should understand that the semiconductor device 30 may be manufactured following the method described above in conjunction with FIGS. 2G-2H, except that after pulling back process is performed on the work function metal layer 148 and before the work function metal layer 150 is formed, the work function metal layer 300 is formed over the work function metal layer 148. In some embodiments, the work function metal layer 300 includes conductive material with low resistance, such as W, TiN, Cu other suitable materials, and/or combinations thereof. In some embodiments, the material of the work function metal layer 300 is different from that of the work function metal layer 150. It is noted that the material of the work function metal layer 300 and the material of the work function metal layer 150 are chosen in order to achieve a desired threshold voltage. In some embodiments, the work function metal layer 300 is formed by a deposition process (e.g., a CVD process or an ALD process), a plating process (e.g., an electrical plating process or an electroless plating process) or other suitable method.

Figure 5:
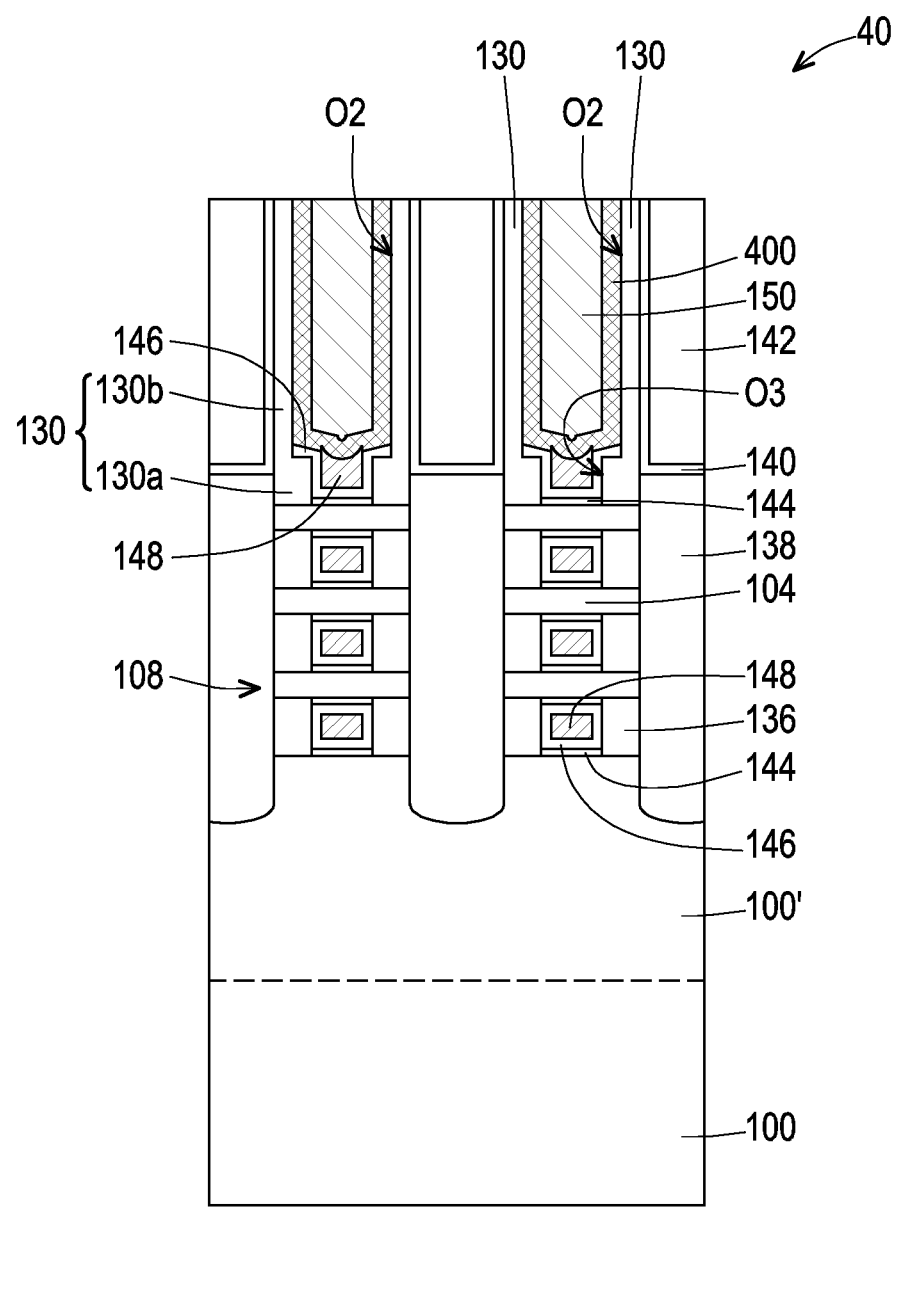
FIG. 5 illustrates a schematic cross-sectional view of a semiconductor device in accordance with some alternative embodiments of the disclosure.
Figure 5:
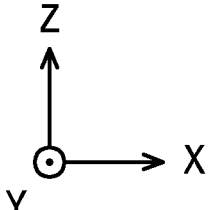

FIG. 5 illustrates a schematic cross-sectional view of a semiconductor device in accordance with some alternative embodiments of the disclosure. The semiconductor device illustrated in FIG. 5 is similar to the semiconductor device 10 illustrated in FIG. 2H, hence the same reference numerals are used to refer to the same or liked parts, and its detailed description will be omitted herein. The differences between the semiconductor device 40 and the semiconductor device 10 lies in that in the semiconductor device 40, a dielectric layer 400 is formed over the work function metal layer 148. As shown in FIG. 5, the dielectric layer 400 is directly contact with the second portions 130b of the sidewall spacers 130. As shown in FIG. 5, the dielectric layer 400 is located between the work function metal layer 150 and the sidewall spacers 130, and between the work function metal layer 148 and the work function metal layer 150. Furthermore, according to the descriptions with respect to FIGS. 1A-1H and FIGS. 2A-2H, those skilled in the art should understand that the semiconductor device 40 may be manufactured following the method described above in conjunction with FIGS. 2G-2H, except that after pulling back process is performed on the work function metal layer 148, the following steps are performed: removing portions of the gate dielectric layer 146 located on the second portions 130b, conformally forming the dielectric layer 400 over the fin structures 108, forming a conductive material layer over the dielectric layer 400 to fill remainder space in the gate trenches O2, and performing a planarization operation, such as a CMP method and/or an etch-back method, to form the work function metal layer 150 and to reveal the top surfaces of the liner layer 140 and the ILD layer 142. In some embodiments, the portions of the gate dielectric layer 146 located on the second portions 130b are removed by etching process. The etching process includes dry etching, wet etching, other etching methods, or combinations thereof. As shown in FIG. 5, during the removing process, the work function metal layer 148 remains substantially intact while the gate dielectric layer 146 is partially removed. This is because the specific etching selectivity is chosen based on the material differences between the work function metal layer 148 and the gate dielectric layer 146. In some embodiments, for the etchant used in the removing process of the gate dielectric layer 146, the etching selectivity of the material of the work function metal layer 148 to the material of the gate dielectric layer 146 is larger than about 100.

In some embodiments, the dielectric layer 400 is made of a low-k dielectric material. In some embodiments, the low-k dielectric material is generally a dielectric material having a dielectric constant (k-value) lower than about 7. Examples of the low-k dielectric material may include SiN, SiCN, SiCN other suitable materials, and/or combinations thereof. In some embodiments, the dielectric layer 400 is formed by suitable fabrication techniques such as spin-on coating, CVD, PVD, ALD, HDPCVD, MOCVD, RPCVD, PECVD, LPCVD, ALCVD, APCVD, other suitable methods, or combinations thereof. As shown in FIG. 5, the dielectric layer 400 is illustrated as a bulky layer, but the disclosure is not limited thereto. In some alternative embodiments, the dielectric layer 400 may be constituted by multiple dielectric layers. In some embodiments, a thickness of the dielectric layer 400 ranges from about 2 nm to about 10 nm. It is noted that by replacing the gate dielectric layer 146 (including the high-k dielectric material) at the second portions 130b with the dielectric layer 400 (including the low-k dielectric material), the improved performance due to the better process window for contact landing and the less parasitic capacitance is provided. In the embodiment shown in FIG. 5, the gate interfacial layer 144, the gate dielectric layer 146 and the dielectric layer 400 collectively refer to as gate dielectric.

In accordance with an embodiment, a method for manufacturing a semiconductor device includes at least the following steps. A fin structure extending along a first direction and having a lower fin structure and an upper fin structure disposed over the lower fin structure is formed, wherein the upper fin structure includes first semiconductor layers and second semiconductor layers alternately stacked. A sacrificial gate structure extending along a second direction perpendicular to the first direction over the upper fin structure is formed. Gate spacers are formed on the sacrificial gate structure. A portion of the sacrificial gate structure is removed to expose the gate spacers. Portions of the exposed gate spacers are removed to form a first gate trench with a first dimension along the first direction. The rest of the sacrificial gate structure is removed to form a second gate trench with a second dimension along the first direction under the first gate trench, wherein the first dimension is greater than the second dimension. A gate dielectric and a first work function metal layer sequentially cover the first and second gate trenches, wherein a first portion of the first work function metal layer merge in the second gate trench, and a second portion of the first work function metal layer is located on sidewalls of the first gate trench. The second portion of the first work function metal layer is removed to expose the gate dielectric located on sidewalls of the first gate trench while remaining the first portion of the first work function metal layer. A second work function metal layer is formed over the first portion of the first work function metal layer to fill the first gate trench.

In accordance with an embodiment, a method for manufacturing a semiconductor device includes at least the following steps. A sacrificial gate structure crossing over a channel region of a fin structure is formed, wherein the sacrificial gate structure comprises a sacrificial gate dielectric layer and a sacrificial gate electrode over the sacrificial gate dielectric layer. Gate spacers are formed on the sacrificial gate structure. Source/drain electrodes is formed over source/drain regions of the fin structure. A first etching process is performed to partially remove the sacrificial gate dielectric layer to expose upper portions of the gate spacers. A second etching process is performed to partially remove the upper portions of the gate spacers to form a first gate trench. A third etching process is performed to remove the sacrificial gate structure to form a second gate trench below the first gate trench, wherein first gate trench is wider than the second gate trench. A first work function metal layer is formed in the first and second gate trenches to fill up the second gate trench and partially fill the first gate trench. A pulling back process is performed to remove the first work function metal layer in the first gate trench. A second work function metal layer is formed to cover the first work function metal layer in the second gate trench.

In accordance with an embodiment, a semiconductor device includes a fin structure, a gate structure, gate spacers and source/drain electrodes. The fin structure extends along a first direction disposed over a substrate, wherein the fin structure comprises semiconductor channel layers. The gate structure extends along a second direction perpendicular to the first direction disposed crossing over a channel region of the fin structure. Gate spacers are disposed on opposite sides of the gate structure, wherein each of the gate spacers includes a first portion and a second portion over the first portion, a dimension of the first portion along the first direction is greater than a dimension of the second portion along the first direction. Source/drain electrodes are located beside the semiconductor channel layers, wherein the gate structure comprises a first work function metal layer and a second work function metal layer over the first work function metal layer, a material of the first work function metal layer is different from a material of the second work function metal layer, the first work function metal layer is located between the first portions of the gate spacers, the second work function metal layer is located between the second portions of the gate spacers, and a dimension of the second work function metal layer along the first direction is greater than a dimension of the first work function metal layer along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a fin structure extending along a first direction and having a lower fin structure and an upper fin structure disposed over the lower fin structure, the upper fin structure including first semiconductor layers and second semiconductor layers alternately stacked;

forming a sacrificial gate structure extending along a second direction perpendicular to the first direction over the upper fin structure;

forming gate spacers on the sacrificial gate structure;

removing a portion of the sacrificial gate structure to expose the gate spacers;

removing portions of the exposed gate spacers to form a first gate trench with a first dimension along the first direction;

removing the rest of the sacrificial gate structure to form a second gate trench with a second dimension along the first direction under the first gate trench, wherein the first dimension is greater than the second dimension;

forming a gate dielectric and a first work function metal layer sequentially covering the first and second gate trenches, wherein a first portion of the first work function metal layer merge in the second gate trench, and a second portion of the first work function metal layer is located on sidewalls of the first gate trench;

removing the second portion of the first work function metal layer to expose the gate dielectric located on sidewalls of the first gate trench while remaining the first portion of the first work function metal layer; and forming a second work function metal layer over the first portion of the first work function metal layer to fill the first gate trench.

2. The method of claim 1, wherein a height measured from a top surface of the fin structure to a top surface of the rest of the sacrificial gate structure along a vertical direction perpendicular to the first direction and the second direction ranges from about 5 nm to about 15 nm.

3. The method of claim 1, wherein the sacrificial gate structure and the gate spacers comprise materials with different etching selectivities.

4. The method of claim 1, wherein the difference between the first dimension and the second dimension ranges from about 5 nm to about 20 nm.

5. The method of claim 1, wherein during the step of removing the second portion of the first work function metal layer, the first portion of the first work function metal layer is partially removed to form a recess on the top.

6. The method of claim 1, further comprising forming a third work function metal layer to fill the recess, wherein a material of the first work function metal layer, a material of the second work function metal layer and a material of the third work function metal layer are different.

7. The method of claim 1, further comprising removing the first semiconductor layers from the first gate trench and the second gate trench to suspend the second semiconductor layers in a channel region of the fin structure, before forming the gate dielectric and the first work function metal layer, wherein the gate dielectric and the first work function metal layer wrap around the suspended second semiconductor layers.

8. The method of claim 1, wherein the gate dielectric comprises a gate interfacial layer and a gate dielectric layer over the gate interfacial layer, wherein the gate dielectric layer comprises high-k dielectric material.

9. The method of claim 8, further comprising removing the gate dielectric layer exposed during the step of removing the second portion of the first work function metal layer; and conformally forming a dielectric layer in the first gate trench, wherein the dielectric layer comprises low-k dielectric material.

10. The semiconductor device of claim 1, wherein the gate structure further comprises a low-k dielectric layer between the first work function metal layer and the second work function metal layer and in directly contact with the second portions of the gate spacers.

11. A method for manufacturing a semiconductor device, comprising:
   forming a sacrificial gate structure crossing over a channel region of a fin structure, wherein the sacrificial gate structure comprises a sacrificial gate dielectric layer and a sacrificial gate electrode over the sacrificial gate dielectric layer;
   forming gate spacers on the sacrificial gate structure;
   forming source/drain electrodes over source/drain regions of the fin structure;
   performing a first etching process to partially remove the sacrificial gate dielectric layer to expose upper portions of the gate spacers;
   performing a second etching process to partially remove the upper portions of the gate spacers to form a first gate trench;

performing a third etching process to remove the sacrificial gate structure to form a second gate trench below the first gate trench, wherein first gate trench is wider than the second gate trench;
   forming a first work function metal layer in the first and second gate trenches to fill up the second gate trench and partially fill the first gate trench;
   performing a pulling back process to remove the first work function metal layer in the first gate trench; and
   forming a second work function metal layer to cover the first work function metal layer in the second gate trench.

12. The method of claim 11, wherein a depth of the second gate trench ranges from about 5 nm to about 15 nm.

13. The method of claim 11, wherein the second gate trench is formed to expose a top surface of the channel region of a fin structure and lower portions of the gate spacers, and each of the lower portions of the gate spacers is wider than each of the upper portions of the gate spacers.

14. The method of claim 11, wherein a material of the first work function metal layer is different form a material of the second work function metal layer.

15. The method of claim 11, wherein during the step of forming the first work function metal layer, a space defined by the first work function metal layer is formed in the first gate trench, wherein the space has a lateral dimension greater than about 2 nm.

16. The method of claim 11, wherein the fin structure comprises first semiconductor layers and second semiconductor layers alternately stacked, a material of each of the first semiconductor layers includes SiGe, and a material of each of the second semiconductor layers includes Si.

17. The method of claim 16, further comprising before forming the first work function metal layer, performing a channel release process to remove the first semiconductor layer from the first gate trench and the second gate trench to suspend the second semiconductor layers in the channel region of the fin structure, wherein the first work function metal layer wraps around the suspended second semiconductor layers.

18. A semiconductor device, comprising:
   a fin structure extending along a first direction disposed over a substrate, wherein the fin structure comprises semiconductor channel layers;
   a gate structure extending along a second direction perpendicular to the first direction disposed crossing over a channel region of the fin structure;
   gate spacers disposed on opposite sides of the gate structure, wherein each of the gate spacers includes a first portion and a second portion over the first portion, a dimension of the first portion along the first direction is greater than a dimension of the second portion along the first direction; and
   source/drain electrodes, located beside the semiconductor channel layers,
   wherein the gate structure comprises a first work function metal layer and a second work function metal layer over the first work function metal layer, a material of the first work function metal layer is different from a material of the second work function metal layer, the first work function metal layer is located between the first portions of the gate spacers, the second work function metal layer is located between the second portions of the gate spacers, and a dimension of the second work function metal layer along the first direction is greater than a dimension of the first work function metal layer along the first direction.

19. The semiconductor device of claim 18, wherein the gate structure further comprises a third work function metal layer between the first work function metal layer and the second work function metal layer, a material of the third work function metal layer is different from the material of the second work function metal layer.

20. The semiconductor device of claim 19, wherein the first work function metal layer has a recess at the top, and the third work function metal layer fills the recess.

\*   \*   \*   \*   \*